United States Patent [19]
Takahashi

[11] Patent Number: 5,525,816
[45] Date of Patent: Jun. 11, 1996

[54] INSULATED GATE SEMICONDUCTOR DEVICE WITH STRIPE WIDTHS

[75] Inventor: Hideki Takahashi, Fukuoka, Japan

[73] Assignee: Mitsubishi Denki Kabushiki Kaisha, Tokyo, Japan

[21] Appl. No.: 327,368

[22] Filed: Oct. 21, 1994

[30] Foreign Application Priority Data

Nov. 5, 1993 [JP] Japan .................................. 5-276876

[51] Int. Cl.⁶ .................................................. H01L 29/00
[52] U.S. Cl. .......................... 257/139; 257/144; 257/164; 257/165; 257/327; 257/328
[58] Field of Search .................................... 257/139, 163, 257/164, 165, 152, 153, 144, 145, 140, 141, 142, 143, 327, 328

[56] References Cited

U.S. PATENT DOCUMENTS

| | | | |
|---|---|---|---|
| 5,089,864 | 2/1992 | Sakurai | 257/144 |
| 5,119,153 | 6/1992 | Korman et al. | 357/23.4 |
| 5,169,793 | 12/1992 | Okabe et al. | 437/31 |
| 5,208,471 | 5/1993 | Mori et al. | 257/327 |
| 5,304,821 | 4/1994 | Hagino | 257/139 X |
| 5,357,120 | 10/1994 | Mori | 257/139 X |
| 5,391,898 | 2/1995 | Hagino | 257/139 |

FOREIGN PATENT DOCUMENTS

| | | |
|---|---|---|
| 0405138 | 1/1991 | European Pat. Off. . |
| 0565349 | 10/1993 | European Pat. Off. . |
| 62-76671 | 4/1987 | Japan . |
| 4229661 | 8/1992 | Japan . |

OTHER PUBLICATIONS

IEEE Transactions on Electron Devices, vol. 36, No. 9–I, Sep. 1989, H. R. Chang, et al., "500–V n–Channel Insulated–Gate Bipolar Transistor with a Trench Gate Structure", pp. 1824–1829.

Primary Examiner—William Mintel
Attorney, Agent, or Firm—Oblon, Spivak, McClelland, Maier & Neustadt

[57] ABSTRACT

There is disclosed an insulated gate bipolar transistor which includes a p type semiconductor region (11) formed in a surface of an n⁻ semiconductor layer (3) by double diffusion in corresponding relation to a p type base region (4) of an IGBT cell adjacent thereto, and an emitter electrode (9) formed on and connected to the p type semiconductor region (11) through a contact hole ($CH_P$) having a width ($W_{ch2}$) which is greater than a width ($W_{ch1}$) of a contact hole ($CH_1$), thereby preventing device breakdown due to latch-up by the operation of a parasitic thyristor during an ON state and during an ON-state to OFF-state transition even if main and control electrodes in an active region are reduced in size.

12 Claims, 36 Drawing Sheets

F I G. 3 1
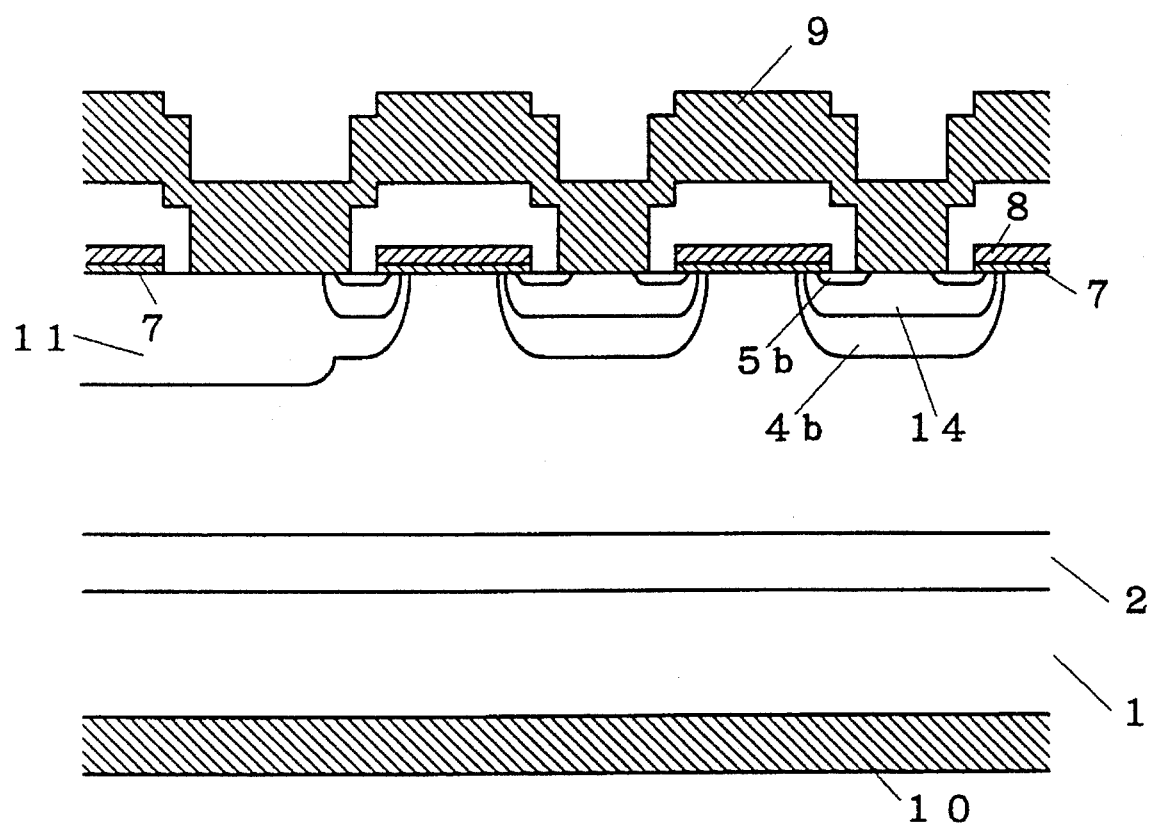

INSULATED GATE SEMICONDUCTOR DEVICE WITH STRIPE WIDTHS

BACKGROUND OF THE INVENTION

1. Field of the Invention

The present invention relates to an insulated gate semiconductor device such as an insulated gate bipolar transistor (referred to as an IGBT hereinafter) and a method of fabricating the same.

2. Description of the Background Art

An insulated gate semiconductor device comprises a plurality of p type and n type semiconductor layers alternately joined together in series such that the semiconductor layers at opposite ends are electrically, connected to positive and negative main electrodes, respectively, and at least one of the other semiconductor layers is joined to a gate electrode applying an electric field through an insulator.

<Construction of Background Art Device> in general, an IGBT comprises a multiplicity of IGBT elements (referred to as IGBT cells hereinafter) connected in parallel. FIG. 32 is a cross sectional view showing a basic structure of an IGBT cell forming the IGBT.

Referring to FIG. 32, a $p^+$ semiconductor layer 1 is formed of a p type semiconductor substrate and has first and second major surfaces, and an $n^+$ buffer layer 2 is formed on the first major surface of the $p^+$ semiconductor layer 1. An $n^-$ semiconductor layer 3 is formed over the $n^+$ buffer layer 2. In a partial surface region of the $n^-$ semiconductor layer 3 is formed p type base regions 4 by selective diffusion of p type impurities. Further, $n^+$ emitter regions 5 are formed in a partial region of the p type base regions 4 by selective diffusion of a high concentration of n type impurities. Upper surfaces of the p type base regions 4 between the surface of the $n^-$ semiconductor layer 3 and the surfaces of the $n^+$ emitter regions 5 serve as channel regions 6. A gate insulation film 7 is formed on the channel regions 6. A gate electrode 8 made of, for example, polycrystalline silicon is formed on the gate insulation film 7.

Emitter electrodes 9 made of, for example, aluminum are formed over the respective upper surfaces of the p type base regions 4 and the $n^+$ emitter regions 5. The gate electrode 8 and the emitter electrodes 9 are insulated from each other. Gate electrodes 8 for all IGBT cells are electrically connected to each other, and emitter electrodes 9 for all IGBT cells are electrically connected to each other. A collector electrode 10 made of aluminum or the like is formed on the second major surface of the $p^+$ semiconductor layer 1. The collector electrode 10 is formed integrally for all IGBT cells.

<Operation of Background Art Device>

In operation, a predetermined collector voltage $V_{CE}$ is initially applied between the emitter electrodes 9 and the collector electrode 10. At this time, when a gate voltage $V_{GE}$ exceeding a threshold value is applied between the emitter electrodes 9 and the gate electrode 8, the channel regions 6 are inverted into n type, and n type channels are formed in the channel regions 6. Electrons as carriers are emitted from the emitter electrodes 9 through the n type channels into the $n^-$ semiconductor layer 3. The emitted electrons causes forward bias between the $p^+$ semiconductor layer 1 and the $n^-$ semiconductor layer 3 (including the $n^+$ buffer layer 2), and holes as carriers are emitted from the $p^+$ semiconductor layer 1. As a result, the resistance of the $n^-$ semiconductor layer 3 decreases significantly and a collector current $I_C$ flowing from the collector electrode 10 to the emitter electrodes 9 reaches a high value. That is, the IGBT comes into conduction (turns on). The resistance relative to the collector current $I_C$ at this time is represented as an ON resistance. The ON resistance is normally indicated by a saturation collector voltage $V_{CE}$(sat) at the time when the collector current $I_C$ has a rated current value. In this manner, the IGBT decreases the resistance of the $n^-$ semiconductor layer 3 by emitting holes from the $p^+$ semiconductor layer 1 to increase a current-carrying capacity.

Operation of the IGBT from the ON state to the OFF state will be discussed below. Referring again to FIG. 32, when the gate electrode 8 is turned off by zero or reverse-biased gate voltage $V_{GE}$ applied between the emitter electrodes 9 and the gate electrode 8 in the ON state, the n-type inverted channel regions 6 return to p type, and the emission of electrons from the emitter electrodes 9 stops. No electrons emitted causes the holes to stop being emitted from the $p^+$ substrate 1. When the electrons and holes left in the $n^-$ semiconductor layer 3 (including the $n^+$ buffer layer 2) move toward the collector electrode 10 and the emitter electrodes 9, respectively, or disappear by recombination. The holes having a mobility smaller than that of the electrons decrease at lower speeds, and the hole current moving toward the emitter electrodes 9 serves as a tail current.

It will be apparent from the construction of the IGBT of FIG. 32 that the IGBT comprises a parasitic bipolar transistor consisting of the $n^+$ emitter region 5, the p type base region 4 and the $n^-$ semiconductor layer 3. This parasitic bipolar transistor generally turns on when the hole current flowing in the p type base region 4 exceeds a value. Turning on of the parasitic bipolar transistor causes a parasitic thyristor consisting of the $n^+$ emitter region 5, the p type base region 4, the $n^-$ semiconductor layer 3, and the $p^+$ semiconductor layer 1 to turn on (referred to as latch-up of the IGBT). Upon latch-up of the IGBT, the gate voltage $V_{GE}$ can no longer control the current (collector current $I_C$) flowing in the IGBT which is then broken down. The breakdown due to latch-up is considered to be liable to occur at specific positions of the IGBT.

FIG. 33 is a plan view of a common IGBT. Referring to FIG. 33, a rectangular gate pad GP is provided in the lower middle of the IGBT. Gate lines GL extend from upper and lower portions of the gate pad GP. The gate line GL from the upper portion extends along the centerline of the IGBT up to a location slightly above the center, and the gate line GL from the lower portion is formed in such a manner as to surround the outer periphery of the IGBT. The emitter electrode 9 is formed in a region enclosed by the central and outer peripheral gate lines GL. IGBT cell regions serving as an active region are indicated by the broken lines of FIG. 33. A p type semiconductor region 11 is formed so as to surround the IGBT cell regions.

FIG. 34 is an enlarged view of a region X enclosed by the dashed-and-dotted lines of FIG. 33, with portions of the emitter electrode 9 removed. Referring to FIG. 34, a multiplicity of IGBT cells are spaced a constant distance $W_{cel}$ from each other in parallel within a corner portion indicated by the lines C-O-C', each of the IGBT cells including a stripe-shaped contact hole having a width $W_{ch1}$. The p type semiconductor region 11 including a stripe-shaped contact hole having the width $W_{ch1}$ is formed outside the corner portion shown by the lines C-O-C'. FIG. 35 is a sectional view taken along the line A-A' of FIG. 34, and FIG. 36 is a sectional view taken along the line B-B' thereof.

FIG. 35 illustrates the IGBT cells described with reference to FIG. 32 which are arranged in parallel such that the emitter electrodes 9 are connected to upper surfaces of the p type base regions 4 and n⁺ emitter regions 5 of the respective IGBT cells through the contact holes having the width $W_{ch1}$. A portion adjacent the side A of FIG. 35 represents a region outside the line C–0 of the corner portion indicated by the lines C–O–C' wherein the p type semiconductor region 11 is formed in the surface of the n⁻ semiconductor layer 3 by double diffusion in corresponding to the p type base region 4 of the adjacent IGBT cell. The emitter electrode 9 is connected to the upper surface of the p type semiconductor region 11 through the contact hole having the width $W_{ch1}$. The p type semiconductor region 11 is much larger than the p type base region 4.

FIG. 36 is a sectional view taken longitudinally of the stripe-shaped contact hole. The p type base region 4 extends in the longitudinal direction of the contact hole, and the emitter electrode 9 extends longitudinally for connection to the p type base region 4. A portion adjacent the side B represents a region outside the line O–C' of the corner portion indicated by the lines C–O–C'. The p type semiconductor region 11 is shown as overlapping the p type base region 4.

Operation of the IGBT having such construction is described when it is on. Holes supplied from the p⁺ semiconductor layer 1 directly below the p type semiconductor region 11 pass through a contact hole $CH_P$ on the upper surface of the p type semiconductor region 11 to the emitter electrode 9. However, some of the holes which do not completely pass through the contact hole $CH_P$ flow into the IGBT cell adjacent the p type semiconductor region 11 since the p type semiconductor region 11 is much larger than the p type base region 4. Thus, the IGBT cell adjacent the p type semiconductor region 11 conducts more hole current than other IGBT cells, and the parasitic thyristor consisting of the n⁺ emitter region 5, the p type base region 4, the n⁻ semiconductor layer 3 and the p⁺ semiconductor layer 1 turns on as above described to cause latch-up of the IGBT. Then the current (collector current $I_C$) flowing in the IGBT is not controlled and the IGBT is broken down.

Such a phenomenon often occurs during transition from the ON state to the OFF state. As above stated, turning off of the gate electrode 8 causes electrons to stop being supplied from the emitter electrode 9 to stop the supply of holes from the p⁺ semiconductor layer 1. The electrons and holes left in the n⁻ semiconductor layer 3 (including the n⁺ buffer layer 2) move toward the collector electrode 10 and the emitter electrodes 9, respectively. In this case, since the electrons have a great mobility, the holes remain after the electrons pass through to the collector electrode 10. When no electrons are left, the holes which disappear by recombination with electrons in the ON state also move toward the emitter electrodes 9.

The result of quantitative analysis of this phenomenon by computer simulation is shown in FIG. 37. FIG. 37 is a graph showing changes with time in current flowing in the IGBT when the IGBT makes an ON-state to OFF-state transition, the abscissa of the graph being time, the ordinate thereof being current value. Referring to FIG. 37, when the IGBT changes from the ON state to the OFF state, the electron current decreases rapidly during the time interval between 1.98 μsec. and 2.06 μsec., and the hole current increases rapidly from about 2.02 μsec. to provide a more than 1.5× increase in hole current. Part of the hole current does not completely pass through the emitter electrodes 9 but flows into the IGBT cell adjacent the p type semiconductor region 11, resulting in latch-up of the IGBT. Hence, the current (collector current $I_C$) flowing in the IGBT is not controlled and the IGBT is broken down.

Recently, size reduction of IGBT cells has advanced for improvement in IGBT characteristics, and the IGBT cell adjacent the p type semiconductor region 11 has been prone to be broken down for the above mentioned reasons. Relation between size reduction of the IGBT cells and breakdown thereof will be described with reference to FIG. 38. FIG. 38 is an enlarged schematic view of FIG. 35.

Consideration is taken into a carrier density in the ON state. The carrier density is uniform within an IGBT cell as illustrated in FIG. 38. It is assumed that carriers extend at an angle of about 45 degrees from a cell end under the p type semiconductor region 11 as shown in FIG. 38. The thickness of the n⁻ semiconductor layer 3 is designated as $t_{n-}$, the depth of the p type base region 4 of the IGBT cell is designated as $P_{xj}$, and the width of the IGBT cell is designated as $W_{cel}$. The number of carriers C1 in a region defined by the centerline G of the gate electrode 8 and the centerline S of the IGBT cell is approximately expressed as:

$$C1 \propto \tfrac{1}{2}(W_{cel}(t_{n-}-P_{xj})) \tag{1}$$

Likewise, the number of carriers C2 in a region defined by the centerline G of the gate electrode 8 and the line $L_{45}$ indicative of spreading of the carriers is approximately expressed as:

$$C2 \propto \tfrac{1}{2}(W_{cel}(t_{n-}-P_{xj})) + \tfrac{1}{2}(t_{n-}-\tfrac{1}{2}W_{cel})^2 \tag{2}$$

The ratio of C2 to C1 is:

$$\frac{C2}{C1} = \frac{W_{ch(p)}}{\tfrac{1}{2} W_{ch(cel)}} = \frac{\tfrac{1}{2} W_{cel} \cdot (t_{n-} - P_{xj}) + \tfrac{1}{2}\left(t_{n-} - \tfrac{1}{2} W_{cel}\right)^2}{\tfrac{1}{2} W_{cel} \cdot (t_{n-} - P_{xj})} \tag{3}$$

where $\tfrac{1}{2}W_{ch(cel)}$ is the size of a contact hole $CH_1$ which is provided on the cell and into which current flows by the carriers in the region defined by the centerline G of the gate electrode 8 and the centerline S of the IGBT cell; and $W_{ch(p)}$ is the size of the contact hole $CH_P$ which is provided on the p type semiconductor region 11 and into which current flows by the carriers in the region defined by the line $L_{45}$ indicative of the spreading of the carriers. Expression (3) is arranged into:

$$\frac{2 W_{ch(p)}}{W_{ch(cel)}} = \frac{t_{n-}^2 + \tfrac{1}{4} W_{cel}^2 - W_{cel} \cdot P_{xj}}{W_{cel}(t_{n-} - P_{xj})} \tag{4}$$

Therefore, if the IGBT cell is reduced in size, Expression (4) approximates:

$$\frac{2 W_{ch(p)}}{W_{ch(cel)}} \approx \frac{t_{n-}}{W_{cel}} \tag{5}$$

This indicates that when the cell width is less than the thickness of the n⁻ semiconductor layer 3 due to size reduction of the IGBT cell, more current flows in the contact hole $CH_P$ than in the contact hole $CH_1$, resulting in a stronger likelihood of IGBT breakdown.

Further, the area of the emitter electrode 9 connected to the p type semiconductor region 11 decreases with size reduction of the IGBT cell, and the holes supplied from the p⁺ semiconductor layer 1 directly below the p type semiconductor region 11 are difficult to pass through to the emitter electrode 9. This also results in IGBT breakdown.

SUMMARY OF THE INVENTION

According to the present invention, an insulated gate semiconductor device comprises: a first semiconductor layer of a first conductivity type and having a relatively low concentration; a plurality of stripe-shaped second semiconductor layers of a second conductivity type selectively formed in parallel in a surface of the first semiconductor layer; a plurality of third semiconductor layers of the first conductivity type and having a relatively high concentration, the third semiconductor layers being selectively formed in respective surfaces of the second semiconductor layers; a plurality of stripe-shaped insulating layers formed on upper surfaces of the first and second semiconductor layers between ends of the third semiconductor layers in the second semiconductor layers; a plurality of stripe-shaped control electrodes formed on the insulating layers; a plurality of layer insulating films covering the control electrodes; the first semiconductor layer, the second semiconductor layers, the third semiconductor layers, the insulating layers, the control electrodes, and the layer insulating films forming an active region; a fourth semiconductor layer of the second conductivity type formed in the surface of the first semiconductor layer so as to enclose the active region; and a plurality of stripe-shaped main electrodes electrically connected to each other, the plurality of main electrodes being classified into first main electrodes formed on upper surfaces of the second and third semiconductor layers which are not covered with the layer insulating films and second main electrodes formed on an upper surface of the fourth semiconductor layer which is not covered with the layer insulating films, wherein a stripe width of the second main electrodes adjacent the active region is greater than a stripe width of the first main electrodes within the active region.

According to another aspect of the invention, an insulated gate semiconductor device comprises: a first semiconductor layer of a first conductivity type and having a relatively low concentration; a plurality of stripe-shaped second semiconductor layers of a second conductivity type selectively formed in parallel in a surface of the first semiconductor layer; a plurality of third semiconductor layers of the first conductivity type and having a relatively high concentration, the third semiconductor layers being selectively formed in respective surfaces of the second semiconductor layers; a plurality of insulating films formed on upper surfaces of the third semiconductor layers and on inner wall surfaces of a plurality of stripe-shaped grooves extending from the upper surface of the third semiconductor layers in the second semiconductor layers through the second semiconductor layers into the first semiconductor layer; a plurality of stripe-shaped control electrodes formed in the grooves having the inner wall surfaces on which the insulating films are formed; a plurality of layer insulating films covering the control electrodes and the insulating films; the first semiconductor layer, the second semiconductor layers, the third semiconductor layers, the insulating films, the control electrodes, and the layer insulating films forming an active region; a fourth semiconductor layer of the second conductivity type formed in the surface of the first semiconductor layer so as to enclose the active region; and a plurality of stripe-shaped main electrodes electrically connected to each other, the plurality of main electrodes being classified into first main electrodes formed on upper surfaces of the second and third semiconductor layers which are not covered with the layer insulating films and second main electrodes formed on an upper surface of the fourth semiconductor layer which is not covered with the layer insulating films, wherein a stripe width of the second main electrodes adjacent the active region is greater than a stripe width of the first main electrodes within the active region.

In the insulated gate semiconductor device according to the present invention, the width of the main electrodes formed on the upper surface of the fourth semiconductor layer adjacent the active region is greater than the main electrodes within the active region, thereby to increase the amount of carrier current flowing into the main electrodes and reduce the amount of carrier current concentrated on the main electrodes within the active region adjacent the fourth semiconductor layer, preventing device breakdown due to operation of the parasitic thyristor when the device is on and changes from the ON state to OFF state. If the main electrodes and control electrodes are reduced in size in the active region, the main electrodes formed on the upper surface of the fourth semiconductor layer adjacent the active region can be wide, to reduce the amount of carrier current concentrated on the main electrodes within the active region adjacent the fourth semiconductor layer and prevent device breakdown due to operation of the parasitic thyristor.

Preferably, the first semiconductor layer has a thickness which is not less than five times a distance between centerlines of the control electrodes adjacent to each other.

The effects by the insulated gate semiconductor device are pronounced when the thickness of the first semiconductor layer is not less than five times the distance between the centerlines of adjacent control electrodes.

Preferably, the third semiconductor layers are not formed in the second semiconductor layers adjacent the fourth semiconductor layer.

Since no parasitic thyristor is formed adjacent the fourth semiconductor layer, the device breakdown due to operation of the parasitic thyristor is prevented if the carrier current is concentrated on the main electrodes in the active region adjacent the fourth semiconductor layer.

Preferably, the insulated gate semiconductor device further comprises: a fifth semiconductor layer of the second conductivity type and having a relatively high concentration, the fifth semiconductor layer being formed in the upper surface of the fourth semiconductor layer below the second main electrodes.

The contact resistance with the main electrodes formed on the upper surface of the fourth semiconductor layer is reduced to promote a carrier current flow, to reduce the amount of carrier current concentrated on the main electrodes within the active region adjacent the fourth semiconductor layer, preventing the device breakdown due to operation of the parasitic thyristor.

The present invention is also intended for a method of fabricating an insulated gate semiconductor device. According to the invention, the method comprises the steps of: (a) providing a first semiconductor layer of a first conductivity type and having a relatively low concentration; (b) forming an insulating film on a surface of the first semiconductor layer and then forming a conductive layer on the insulating film; (c) patterning the conductive layer to form a plurality of stripe-shaped control electrodes; (d) implanting an impurity of a second conductivity type by using the control electrodes as a mask to form a plurality of stripe-shaped second semiconductor layers of the second conductivity type between the control electrodes; (e) implanting an impurity of the first conductivity type into the second semiconductor layers to selectively form third semiconductor layers of the first conductivity type; (f) implanting an impurity of the second conductivity type into a predetermined portion of the first semiconductor layer to form a fourth semiconductor layer of the second conductivity type; (g) forming layer insulating films so as to enclose the control electrodes; and (h) forming a plurality), of stripe-shaped main electrodes on upper surfaces of the second and third semiconductor layers and an upper surface of the fourth semiconductor layer between the layer insulating films, the main electrodes being electrically connected to each other.

This method is suitable for fabrication of the insulated gate semiconductor device of the present invention.

Preferably, the step (f) is performed after the step (a).

This provides a more practical method suitable for fabrication of the insulated gate semiconductor device of the present invention.

Preferably, a mask is used in the step (e) which mask is designed such that the third semiconductor layers are not formed in the second semiconductor layers adjacent the fourth semiconductor layer.

Thus, the parasitic thyristor is not formed adjacent the fourth semiconductor layer. If the carrier current is concentrated on the main electrodes within the active region adjacent the fourth semiconductor layer, the method is provided which is suitable for fabrication of the insulated gate semiconductor device that prevents the device breakdown due to operation of the parasitic thyristor.

Preferably, the method further comprises the step of: implanting an impurity of the second conductivity type into the fourth semiconductor layer to form a stripe-shaped fifth semiconductor layer of the second conductivity type prior to the step (e).

The formation of the stripe-shaped fifth semiconductor layer of the second conductivity type in the fourth semiconductor layer can promote a carrier current flow to reduce the carrier current concentrated on the main electrodes within the active region adjacent the fourth semiconductor layer. The method is provided which is suitable for fabrication of the insulated gate semiconductor device that prevents the device breakdown due to operation of the parasitic thyristor.

According to another aspect of the invention, the method comprises the steps of: (a) providing a first semiconductor layer of a first conductivity type and having a relatively low concentration; (b) implanting an impurity of a second conductivity type into a surface of the first semiconductor layer to form a second semiconductor layer of the second conductivity type; (c) implanting an impurity of the first conductivity type into a surface of the second semiconductor layer to selectively form third semiconductor layers of the first conductivity type; (d) forming a plurality of stripe-shaped grooves extending from an tipper surface of the third semiconductor layer through the second and third semiconductor layers into the first semiconductor layer; (e) forming an insulating film on inner wall surfaces of the grooves and the upper surfaces of the second and third semiconductor layers; (f) forming a conductive layer in the grooves and on an upper surface of the insulating film; (g) patterning the conductive layer to form a plurality of stripe-shaped control electrodes; (h) implanting an impurity of the second conductivity type into a predetermined portion of the first semiconductor layer to form fourth semiconductor layer of the second conductivity type; (i) forming layer insulating films so as to enclose the control electrodes and the insulating film on the upper surfaces of the third semiconductor layers; and (j) forming a plurality of stripe-shaped main electrodes on the upper surfaces of the second and third semiconductor layers and an upper surface of the fourth semiconductor layer between the layer insulating films, the main electrodes being electrically connected to each other.

This method is suitable for fabrication of the insulated gate semiconductor device of the present invention.

Preferably, the step (h) is performed after the step (a).

This provides a more practical method suitable for fabrication of the insulated gate semiconductor device of the present invention.

Preferably, a mask is used in the step (c) which mask is designed such that the third semiconductor layers are not formed in the second semiconductor layer adjacent the fourth semiconductor layer.

Thus, the parasitic thyristor is not formed adjacent the fourth semiconductor layer. If the carrier current is concentrated on the main electrodes within the active region adjacent the fourth semiconductor layer, the method is provided which is suitable for fabrication of the insulated gate semiconductor device that prevents the device breakdown due to operation of the parasitic thyristor.

Preferably, the method further comprises the step of: implanting an impurity of the second conductivity type into the fourth semiconductor layer to form a stripe-shaped fifth semiconductor layer of the second conductivity type prior to the step (d).

The formation of the stripe-shaped fifth semiconductor layer of the second conductivity type in the fourth semiconductor layer can promote a carrier current flow to reduce the carrier current concentrated on the main electrodes within the active region adjacent the fourth semiconductor layer. The method is provided which is suitable for fabrication of the insulated gate semiconductor device that prevents the device breakdown due to operation of the parasitic thyristor.

It is an object of the present invention to provide an insulated gate transistor which is prevented from being broken down due to latch-up.

These and other objects, features, aspects and advantages of the present invention will become more apparent from the following detailed description of the present invention when taken in conjunction with the accompanying drawings.

BRIEF DESCRIPTION OF THE DRAWINGS

FIG. 31 is a fragmentary sectional view of a second modification of the insulated gate semiconductor device according to the present invention;

DESCRIPTION OF THE PREFERRED EMBODIMENTS

<First Preferred Embodiment>

Description will be given on an insulated gate semiconductor device and a method of fabricating the same of a first preferred embodiment according to the present invention.

<Device Construction>

Figure 1:
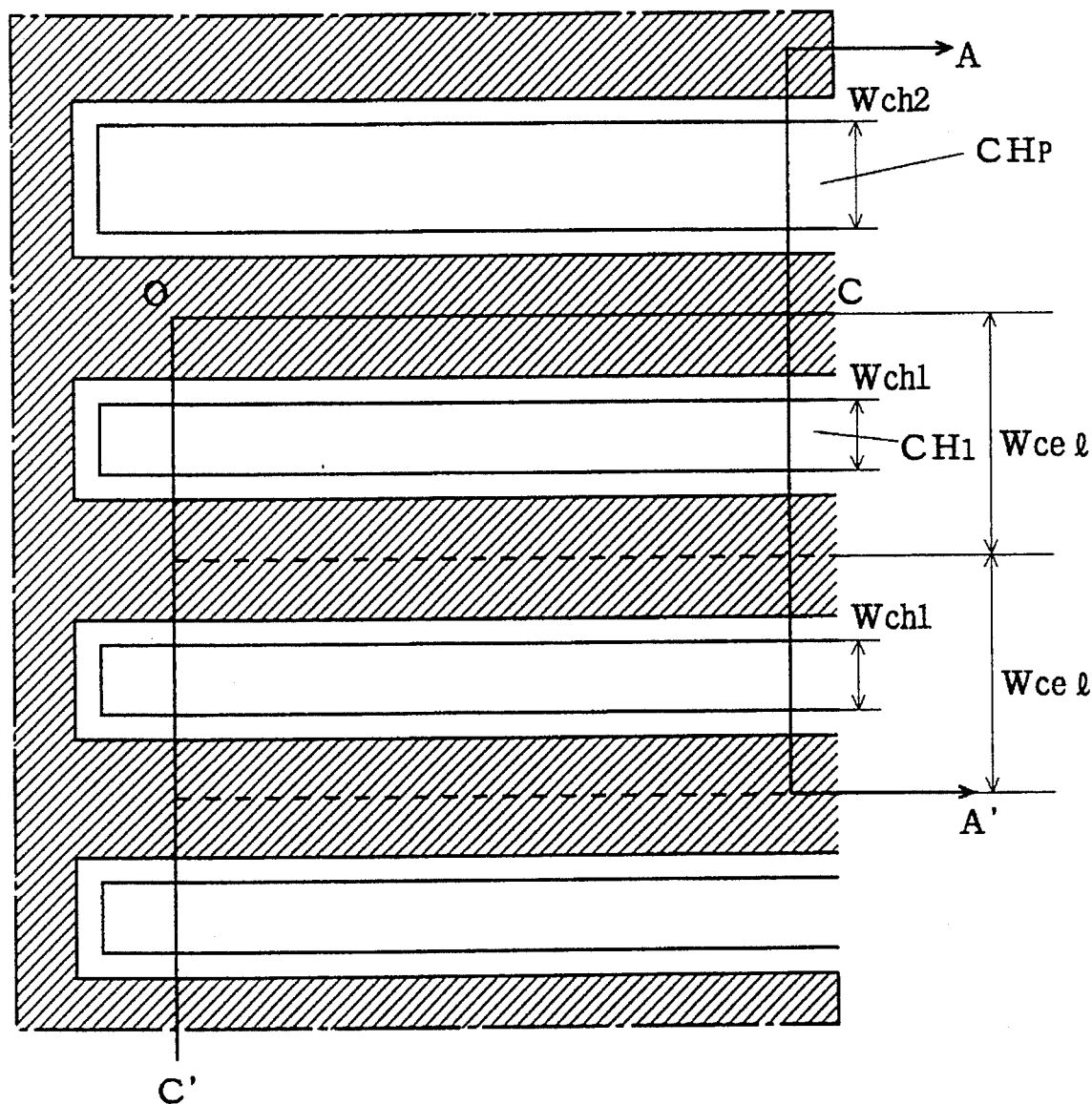
FIG. 1 is a fragmentary plan view of an insulated gate semiconductor device of a first preferred embodiment according to the present invention.
Figure 33:
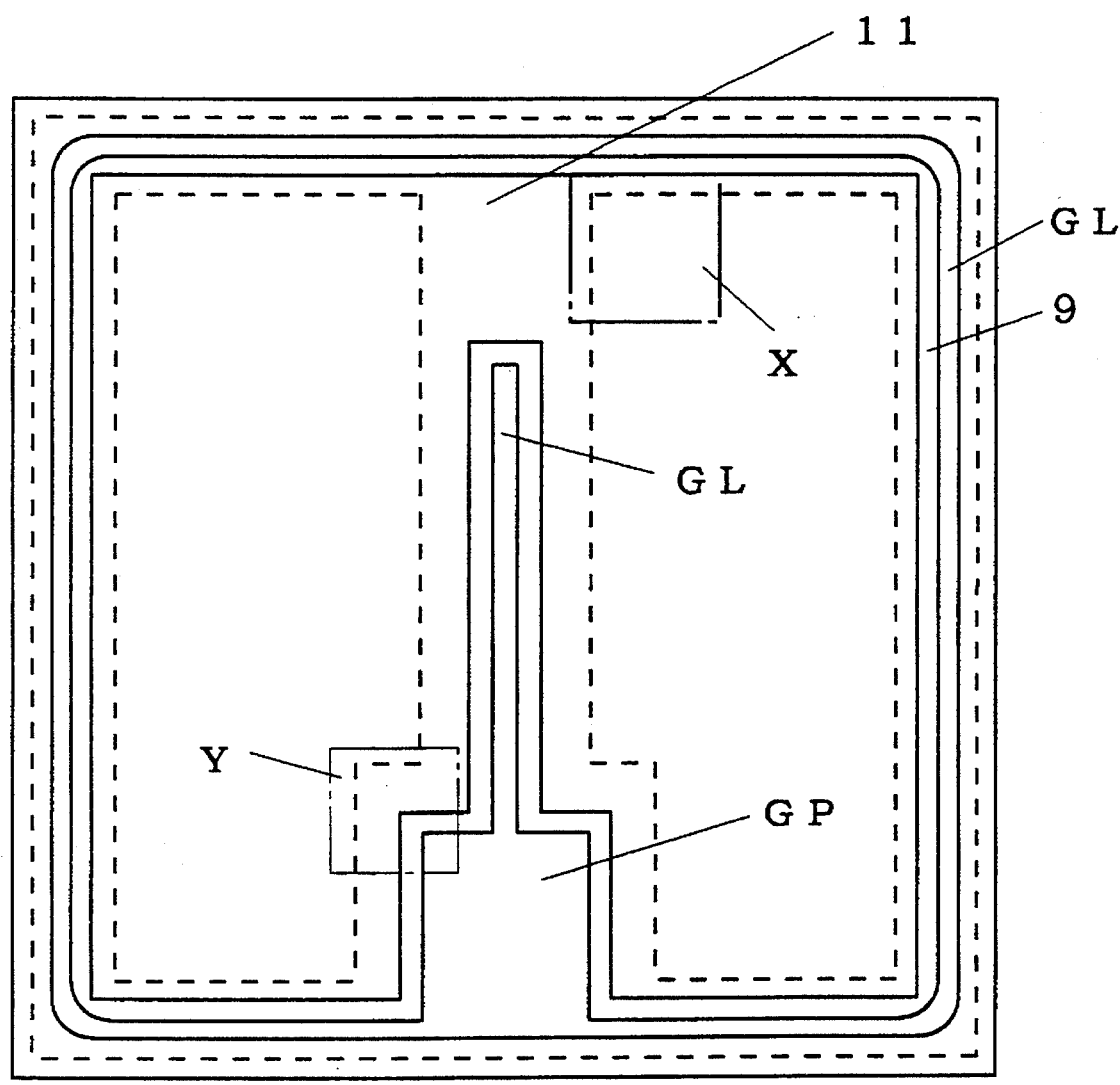
FIG. 33 is a plan view showing a basic structure of the insulated gate semiconductor device.
Figure 34:
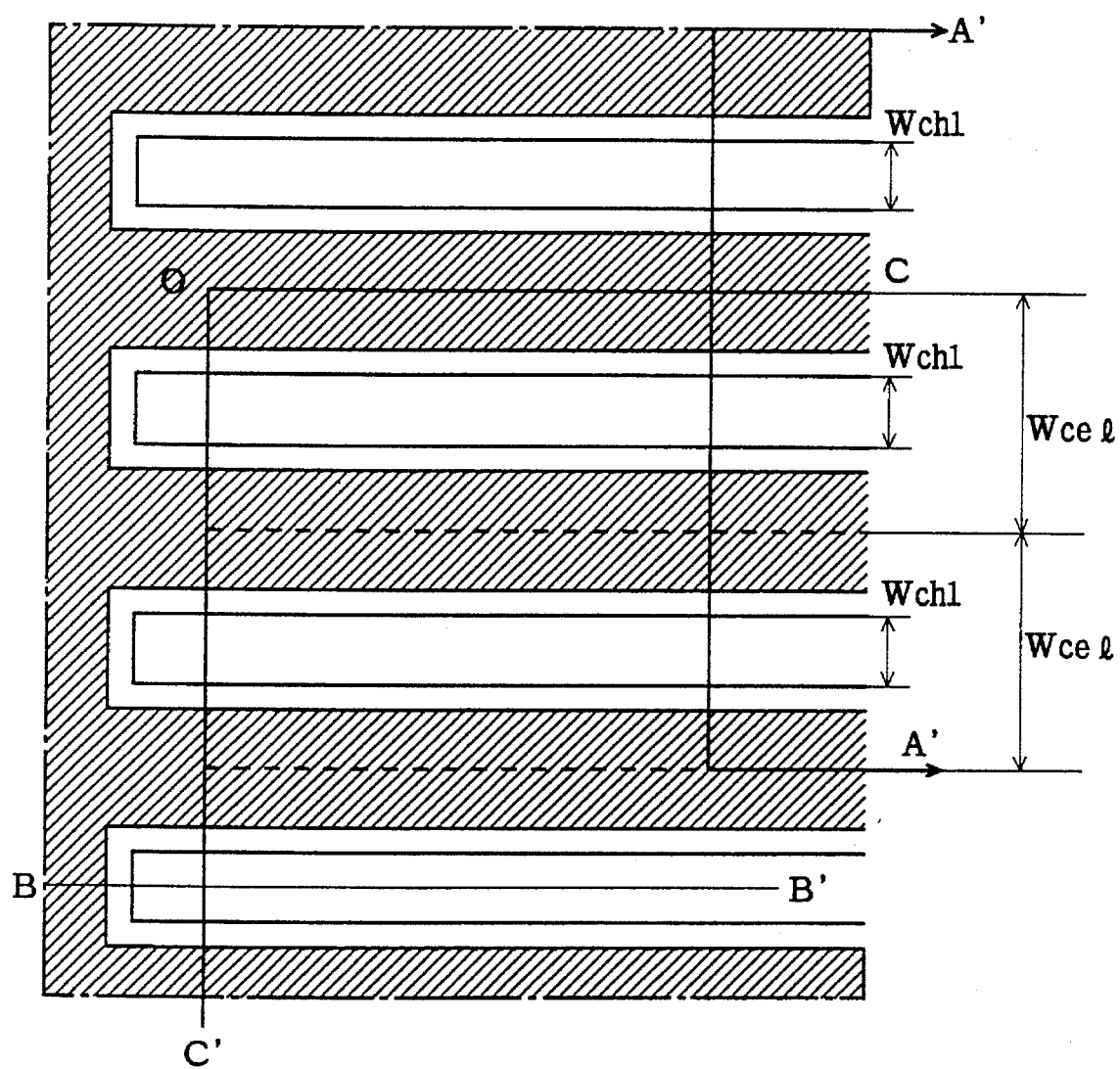
FIG. 34 is a fragmentary plan view showing a basic structure of a conventional insulated gate semiconductor device.

FIG. 1 is an enlarged view of a portion corresponding to the region X enclosed by the dashed-and-dotted lines of FIG. 33 used for description of the conventional IGBT.

Figure 2:
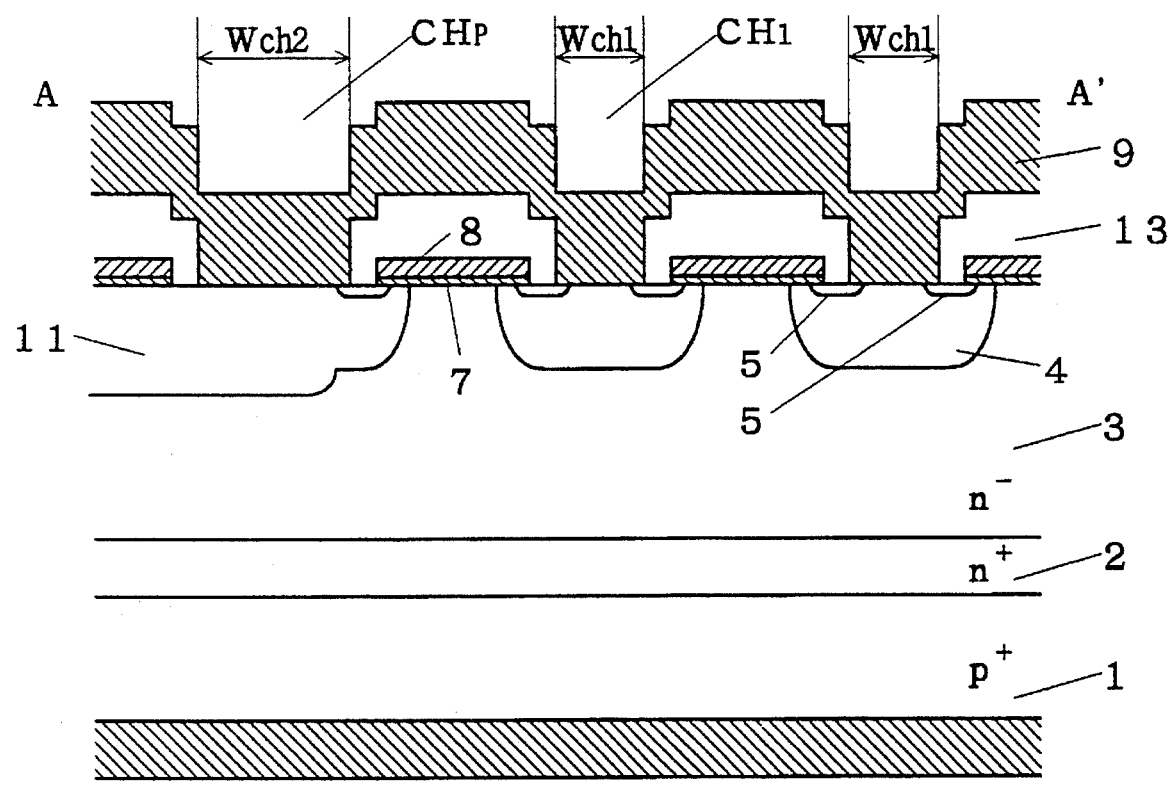
FIG. 2 is a fragmentary sectional view of the insulated gate semiconductor device of the first preferred embodiment.

Referring to FIG. 1, stripe-shaped IGBT cells each including a contact hole $CH_1$ having a width $W_{ch1}$ are spaced a constant distance $W_{cel}$ from each other in parallel inside a corner portion indicated by the lines C–O–C'. A p type semiconductor region 11 including a stripe-shaped contact hole $CH_P$ having a width $W_{ch2}$ is formed outside the corner portion indicated by the lines C–O–C'. FIG. 2 is a sectional view taken along the line A–A' of FIG. 1.

Figure 35:
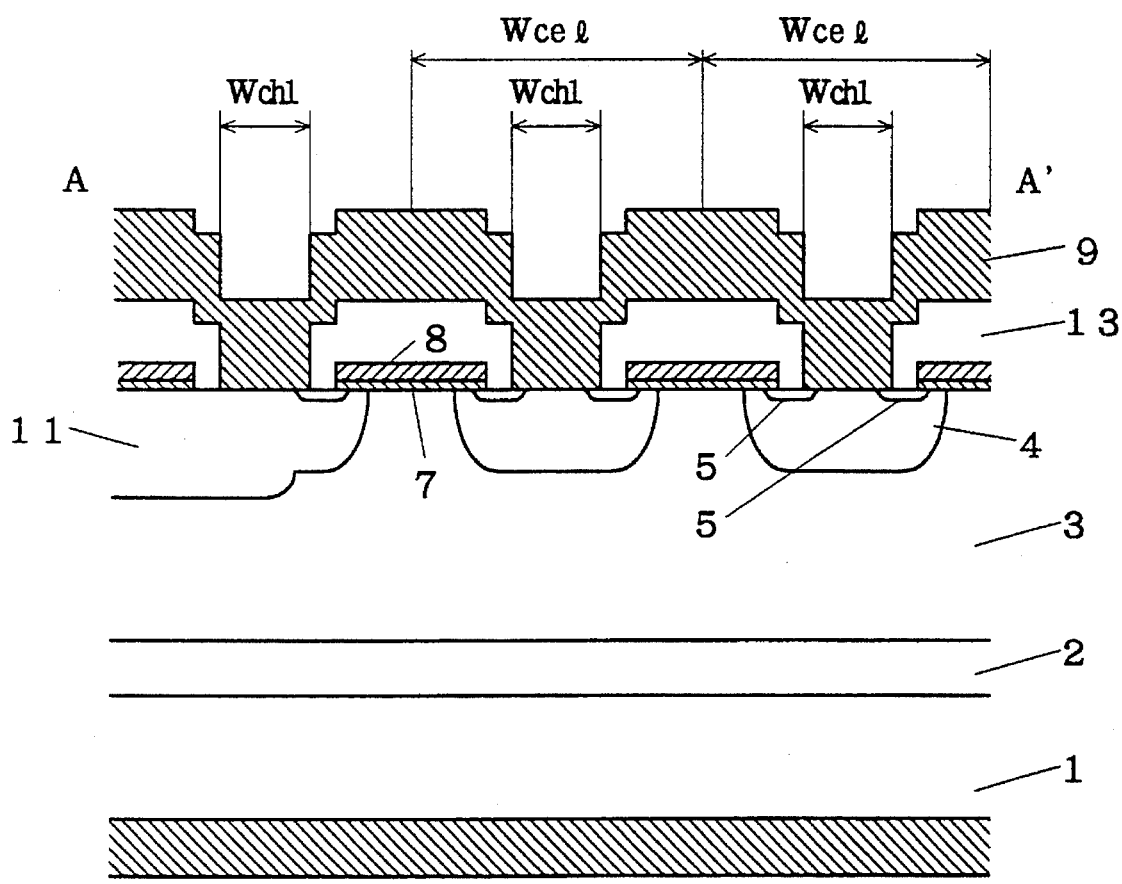
FIGS. 35 and 36 are fragmentary sectional views showing the basic structure of the conventional insulated gate semiconductor device.
Figure 36:
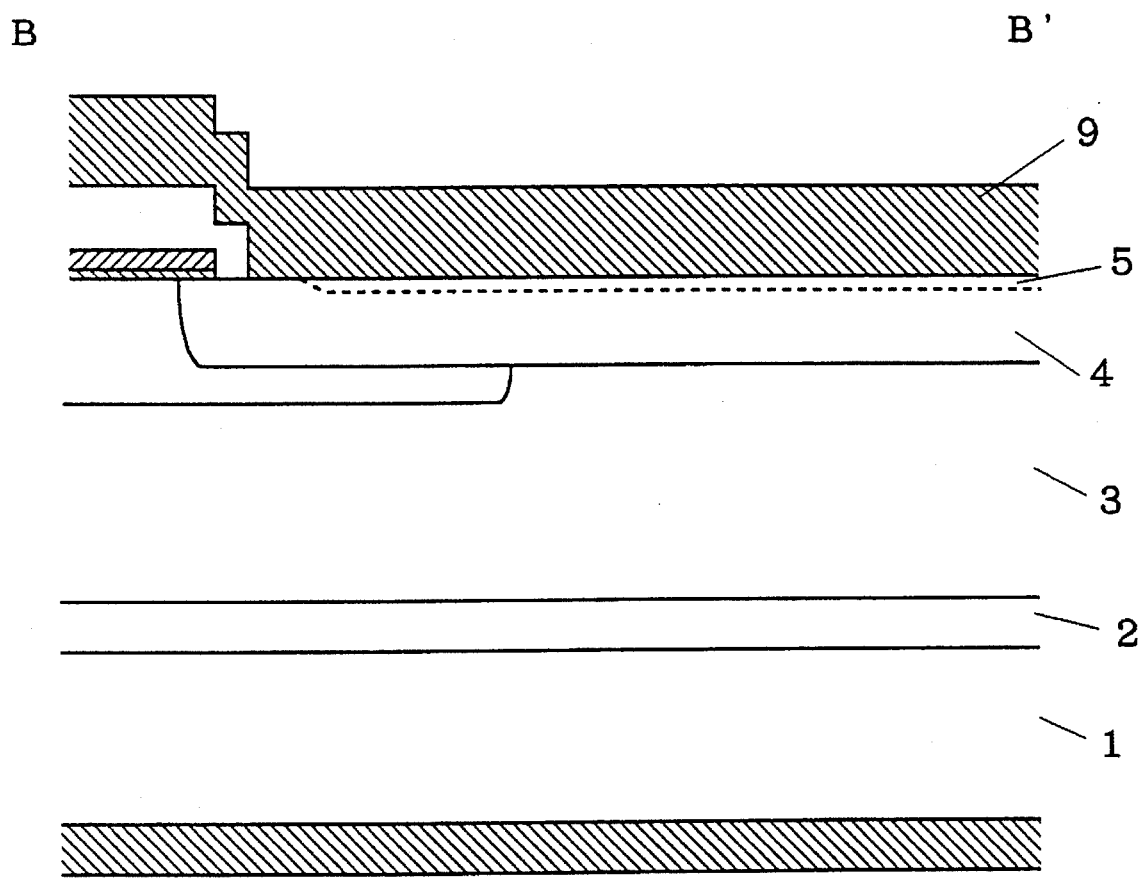
Figure 37:
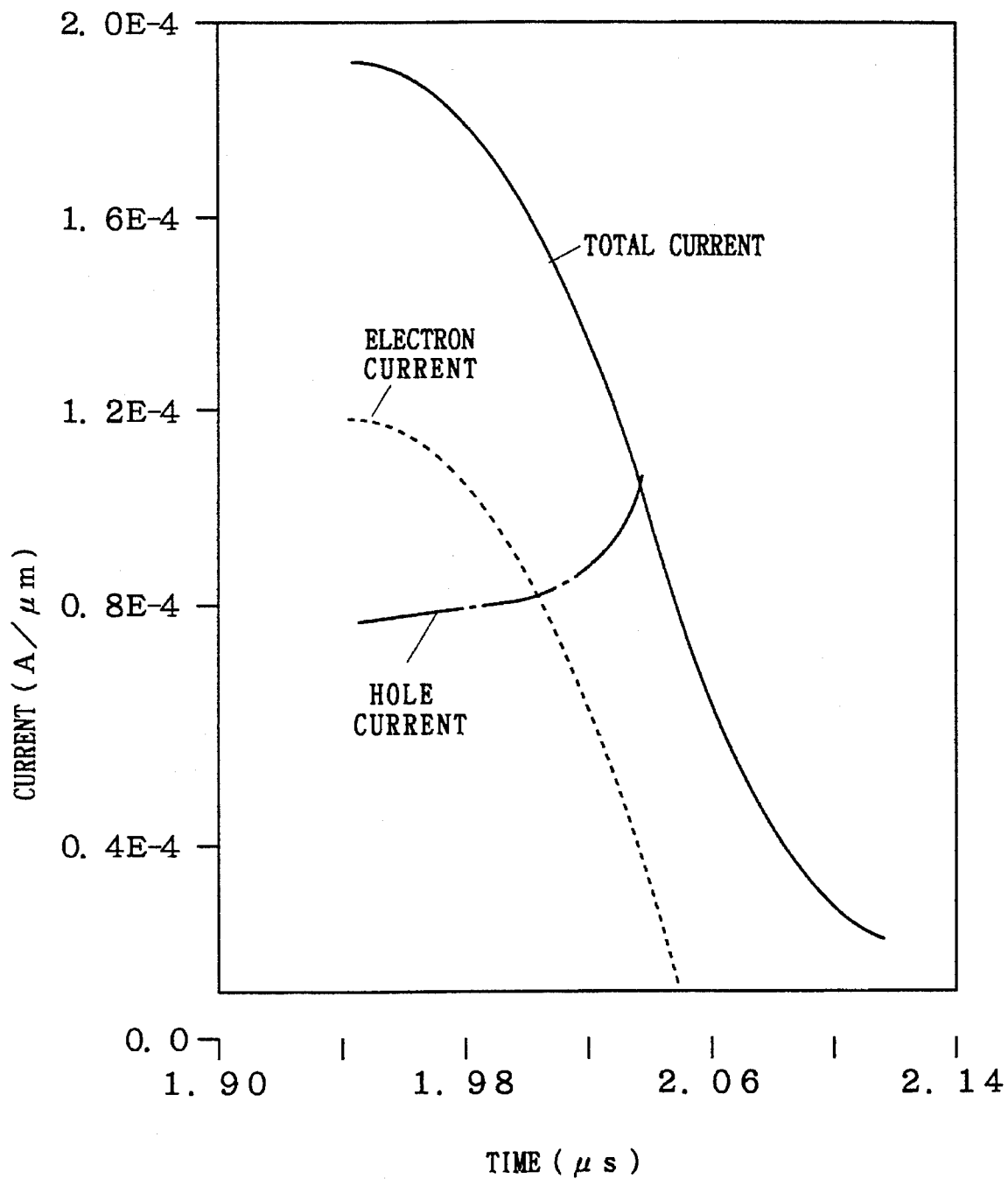
FIG. 37 illustrates operating characteristics of the conventional insulated gate semiconductor device.

FIG. 2 illustrates the IGBT cells described with reference to FIG. 32 which are arranged in parallel such that emitter electrodes 9 are connected to upper surfaces of p type base regions 4 and $n^+$ emitter regions 5 of the respective IGBT cells through the contact holes $CH_1$ having the width $W_{ch1}$. A portion adjacent the side A of FIG. 2 represents a region outside the line C–O of the corner portion indicated by the lines C–O–C' wherein the p type semiconductor region 11 is formed in a surface of an $n^-$ semiconductor layer 3 by double diffusion in corresponding relation to the p type base region 4 of an adjacent IGBT cell and the emitter electrode 9 is connected to an upper surface of the p type semiconductor region 11 through the contact hole $CH_P$ having the width $W_{ch2}$ greater than the width $W_{ch1}$ of the contact hole $CH_1$. Like reference numerals and characters are used to designate parts identical with those of FIG. 35.

In operation, the IGBT constructed as shown in FIG. 2 is adapted such that holes supplied from the $p^+$ semiconductor layer 1 directly below the p type semiconductor region 11 pass through the contact hole $CH_P$ having the width $W_{ch2}$ in the p type semiconductor region 11 to the emitter electrodes 9 when the IGBT is on. In this case, if the width $W_{ch2}$ of the contact hole $CH_P$ in the p type semiconductor region 11 is large enough to permit the hole current in the region defined by the line $L_{45}$ of FIG. 38 indicative of the spreading of the carriers to pass through completely, excessive hole current does not concentrate on the IGBT cell adjacent the p type semiconductor region 11 to prevent a stronger likelihood of the breakdown of the IGBT cell adjacent the p type semiconductor region 11 than that of other IGBT cells due to latch-up.

Further, during an ON-state to OFF-state transition of the IGBT, formation of the contact hole $CH_P$ having the width $W_{ch2}$ which is large enough to meet rapid increase in hole current can remedy such a situation in which the hole current does not completely pass through to the emitter electrodes 9 but excessive hole current flows into the IGBT cell adjacent the p type semiconductor region 11. This also prevent the stronger likelihood of the breakdown of the IGBT cell adjacent the p type semiconductor region 11 than that of other IGBT cells due to latch-up.

In the first preferred embodiment, size reduction of the IGBT cells does not interfere with the large width $W_{ch2}$ of the contact hole $CH_P$ on the p type semiconductor region 11. Thus, if the width of the IGBT cells reduced in size is less than the thickness of the $n^-$ semiconductor layer 3 and more current flows in the contact hole $CH_P$ than in the contact hole $CH_1$, also prevented is the stronger likelihood of the breakdown of the IGBT cell adjacent the p type semiconductor region 11 than that of other IGBT cells due to latch-up.

The first preferred embodiment functions effectively when the ratio of the IGBT cell width to the thickness of the $n^-$ semiconductor layer 3 which indicates the degree of size reduction of the IGBT cell is not less than 1 to 5.

<Another Application>

The region X enclosed by the dashed-and-dotted lines of FIG. 33 is described hereinabove. A portion corresponding to a region Y enclosed by the dashed-and-doted lines of FIG. 33 will be discussed below.

Figure 3:
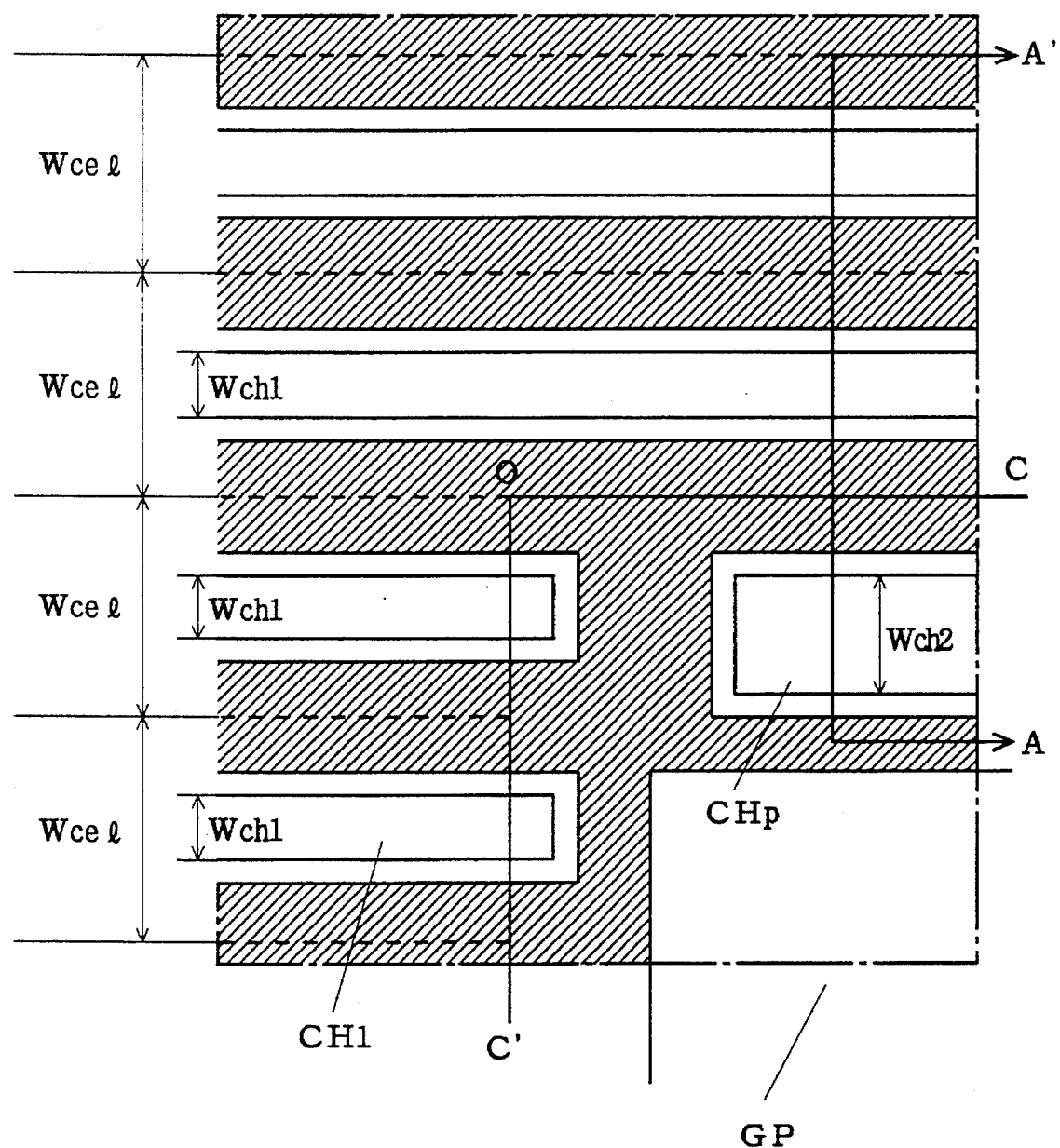
FIG. 3 is a fragmentary plan view of the insulated gate semiconductor device of the first preferred embodiment.
Figure 4:
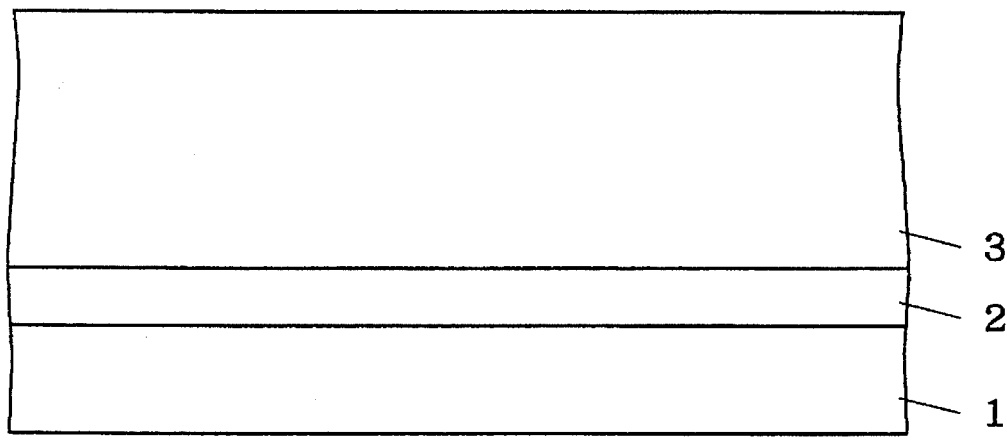
FIG. 4 to 9 are sectional views showing process steps for fabrication of the insulated semiconductor device of the first preferred embodiment.

FIG. 3 is an enlarged view of the region Y. Referring to FIG. 3, the gate pad GP adjacent the corner portion is formed perpendicularly to the IGBT cells, which causes the p type semiconductor region 11 to protrude to form a recessed IGBT cell region. This preferred embodiment provides the contact hole $CH_P$ wider than the contact holes $CH_1$ in the protruding p type semiconductor region 11 parallel to the IGBT cells without changing the arrangement of the IGBT cells and permits contact between the emitter electrodes 9 and the p type semiconductor region 11 through the contact hole $CH_P$.

With continued reference to FIG. 3, the stripe-shaped IGBT cells each including the contact hole $CH_1$ having the width $W_{ch1}$ are spaced the constant distance $W_{cel}$ from each other in parallel outside the corner portion indicated by the lines C–O–C'. The p type semiconductor region 11 including the stripe-shaped contact hole $CH_P$ having the width $W_{ch2}$ is formed inside the corner portion indicated by the lines C–O–C'. The section taken along the line A–A' of FIG. 3 is similar to that of FIG. 2.

In operation, this application exhibits effects when the IGBT is on, when the IGBT makes the ON-state to OFF-state transition, and when the IGBT cells are reduced in size, similar to the application of this preferred embodiment to the region X.

<Fabrication Method>

FIGS. 4 to 9 are sectional views showing process steps for fabrication of the IGBT of FIG. 2 in sequential order. In the process step shown in FIG. 4, the $p^+$ semiconductor layer 1 serving as a substrate (e.g., a single crystal Si substrate) is prepared. The $n^+$ buffer layer 2 and the $n^-$ semiconductor layer 3 are sequentially formed on the first major surface of the $p^+$ semiconductor layer 1 by epitaxial growth technique.

Figure 5:
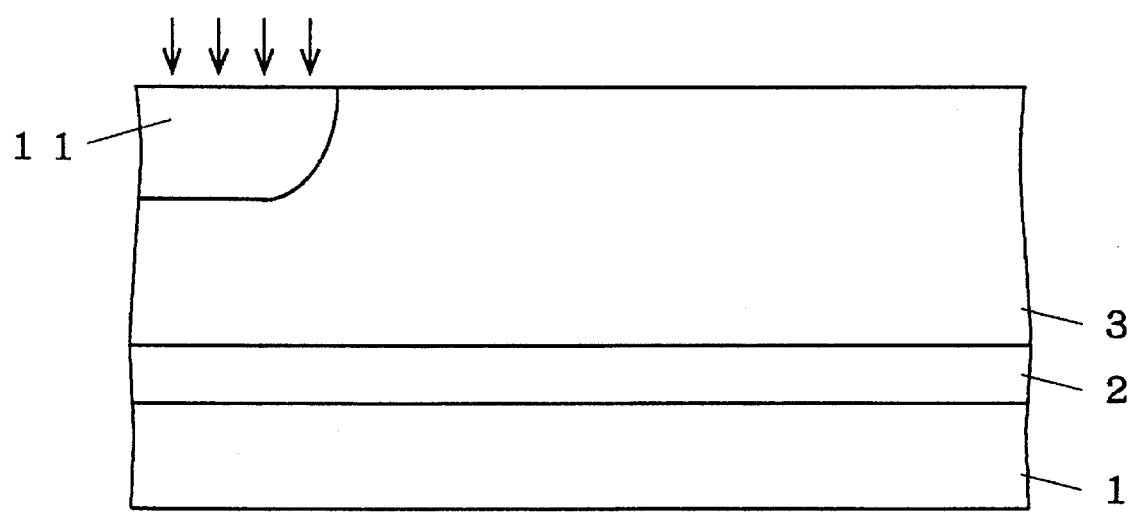

In the process step shown in FIG. 5, p type impurities (e.g., boron) are implanted into a predetermined portion of the $n^-$ semiconductor layer 3 and are then annealed to form the p type semiconductor region 11.

Figure 6:
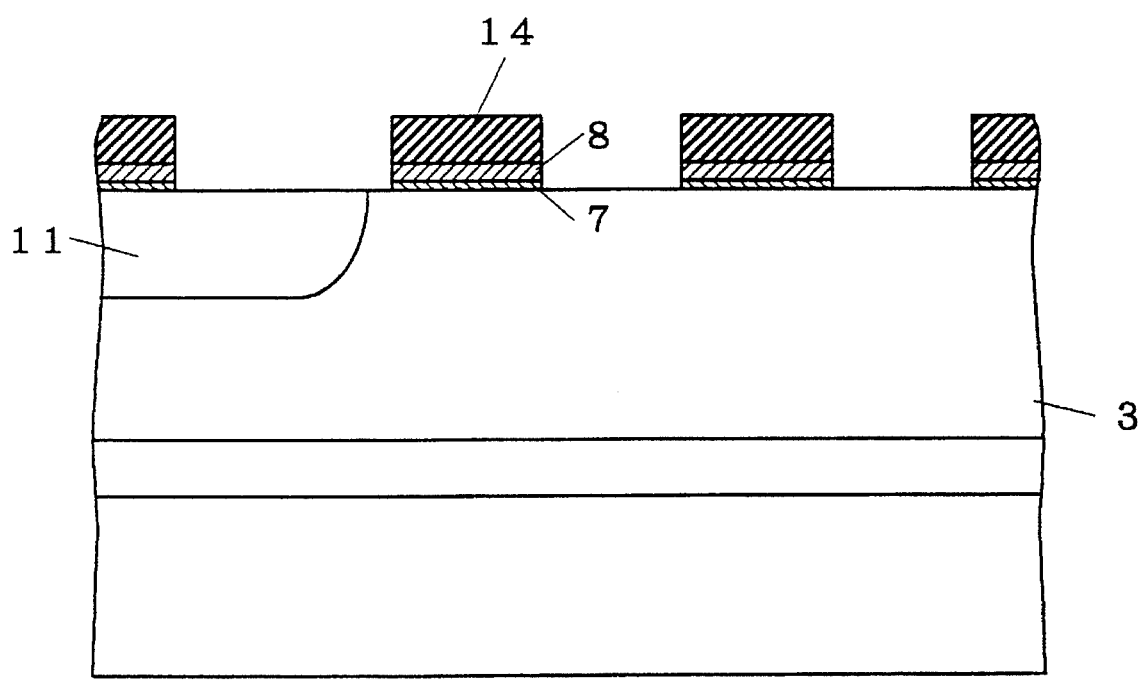

In the process step shown in FIG. 6, an insulating film such as a thermal oxidation film is formed on the surface of the $n^-$ semiconductor layer 3. A polysilicon layer is formed on the insulating film by deposition. A resist 14 is applied over the polysilicon layer to form a desired resist pattern. The polysilicon layer and the insulating film are etched to form the gate electrodes 8 placed on gate insulation films 7 into the desired pattern. The resist pattern used herein is designed so that a pattern spacing is wide on the p type semiconductor region 11.

Figure 7:
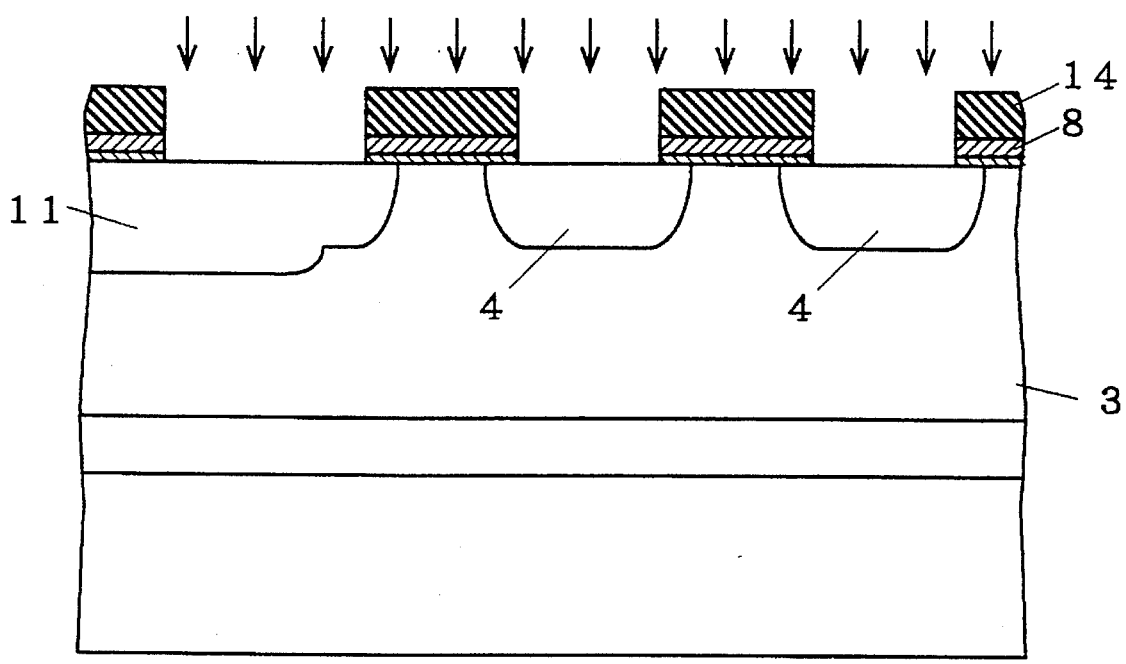

In the process step shown in FIG. 7, p type impurities are implanted from above the resist 14 used in the previous process step and remaining on the gate electrodes 8 and are then annealed to form the p type base regions 4 in the surface of the $n^-$ semiconductor layer 3 between the gate electrodes 8. This results in double diffusion of p type impurities in the p type semiconductor region 11. Then the resist on the gate electrodes 8 is removed.

Figure 8:
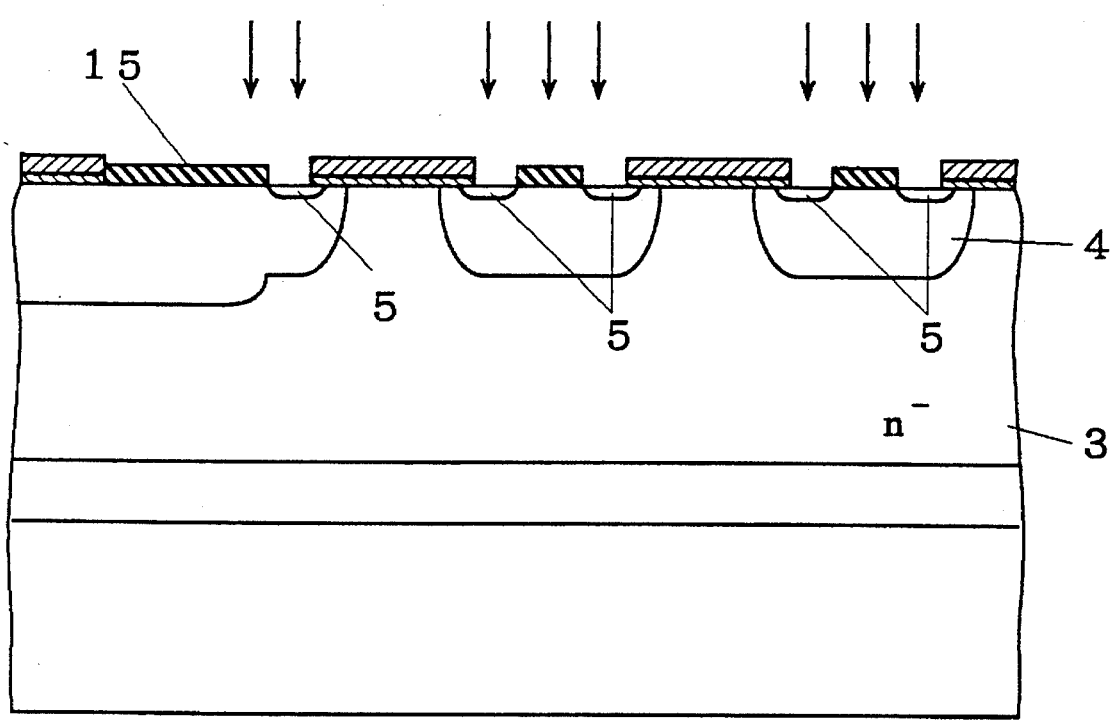

In the process step shown in FIG. 8, a mask 15 having a desired pattern is formed on an upper surface of the p type base regions 4 and n type impurities (e.g., arsenic) are implanted and annealed for formation of the $n^+$ emitter regions 5.

Figure 9:
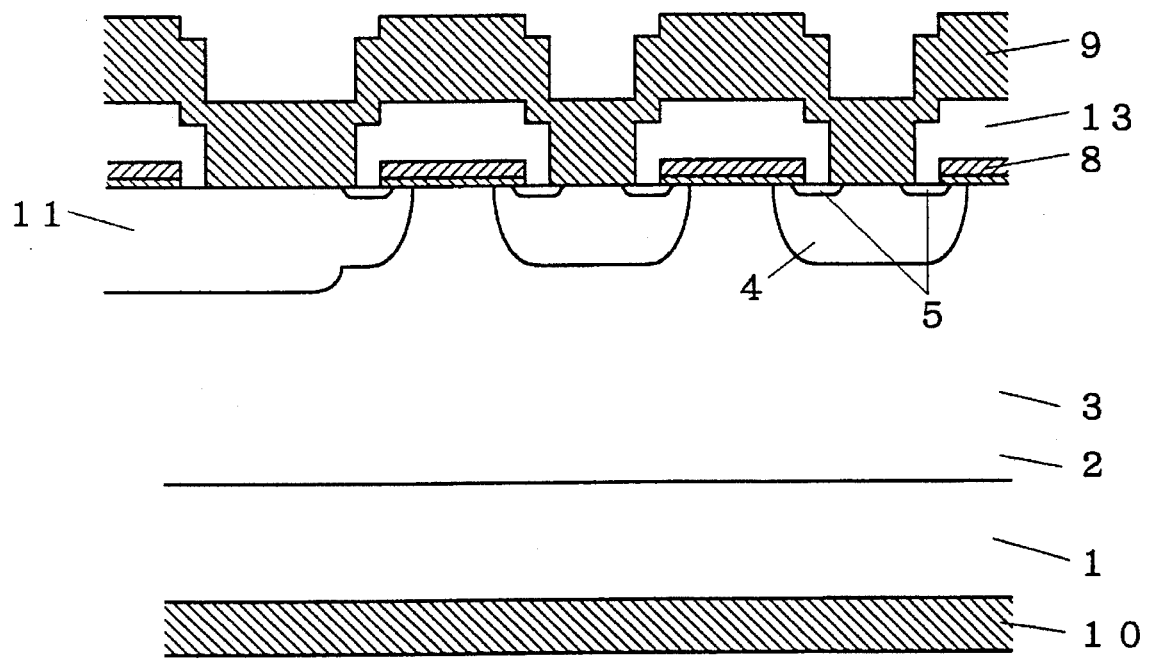

In the process step shown in FIG. 9, layer insulation films 13 made of, for example, PSG (phospho-silicate glass) are formed so as to surround the gate electrodes 8. Then the emitter electrodes 9 made of, for example, aluminum are formed over upper surfaces of the p type base regions 4 and $n^+$ emitter regions 5 between the layer insulation films 13. Emitter electrodes 9 for all IGBT cells are 10 connected to each other. Finally, the collector electrode 10 made of, for example, aluminum is formed over the second major surface of the $p^+$ semiconductor layer 1 integrally for all IGBT cells. This completes the IGBT of FIG. 2.

<Second Preferred Embodiment>

Description will be given on the insulated gate semiconductor device and the method of fabricating the same of a second preferred embodiment according to the present invention.

<Device Construction>

Figure 10:
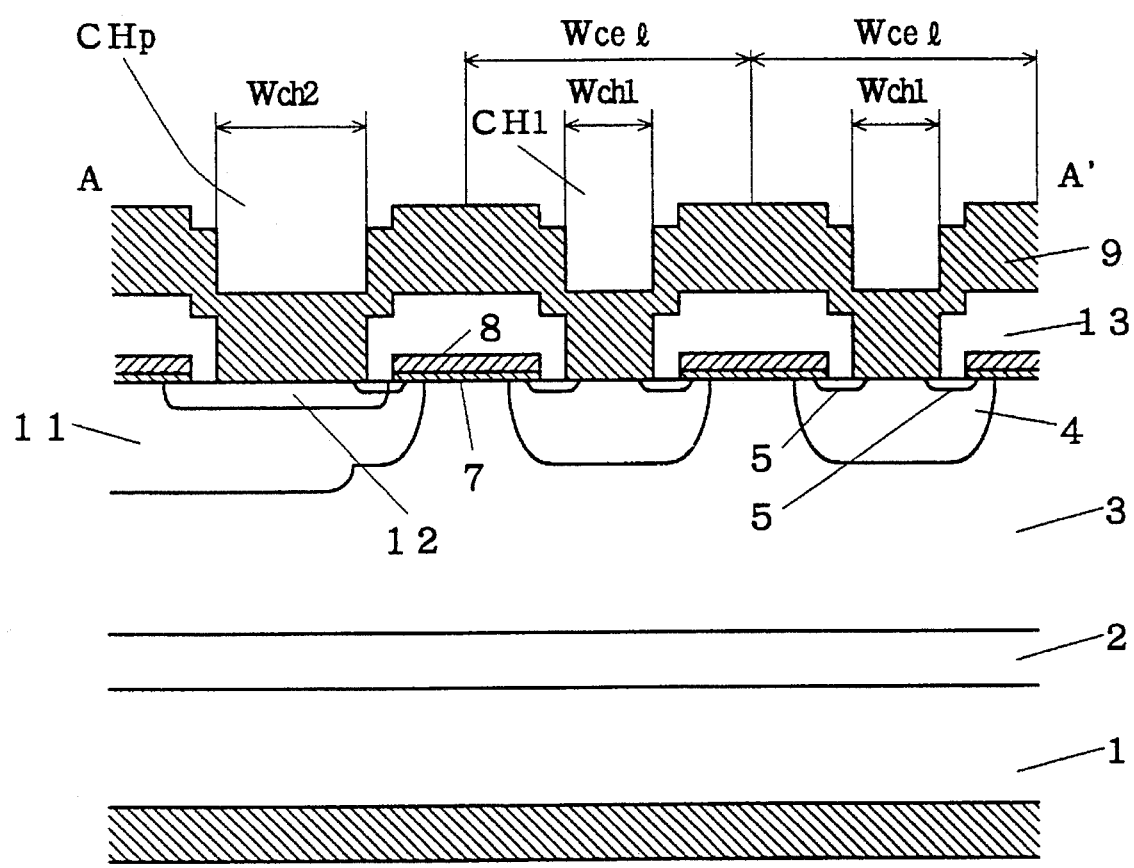
FIG. 10 is a fragmentary sectional view of the insulated gate semiconductor device of a second preferred embodiment according to the present invention.

The plan structure of the second preferred embodiment is similar to that of the first preferred embodiment shown in FIGS. 1 and 3. FIG. 10 illustrates a sectional structure taken along the line A–A' of FIGS. 1 and 3.

FIG. 10 illustrates the IGBT cells described with reference to FIG. 32 which are arranged in parallel such that the emitter electrodes 9 are connected to the upper surfaces of the p type base regions 4 and $n^+$ emitter regions 5 of the respective IGBT cells through the contact holes $CH_1$ having the width $W_{ch1}$. In a portion adjacent the side A of FIG. 10, the p type semiconductor region 11 is formed in the surface of the $n^-$ semiconductor layer 3 by double diffusion in corresponding relation to the p type base regions 4 of the IGBT cells, and a $p^+$ semiconductor layer 12 having a higher concentration than that of the p type semiconductor region 11 is formed partially in a surface of the p type semiconductor region 11. The contact hole $CH_P$ having the width $W_{ch2}$ greater than the width $W_{ch1}$ of the contact holes $CH_1$ is formed on the top surface above the $p^+$ semiconductor layer 12, and the emitter electrode 9 is connected to the $p^+$ semiconductor layer 12 through the contact hole $CH_P$. Like reference numerals and characters are used to designate parts identical with those of FIG. 35.

Figure 38:
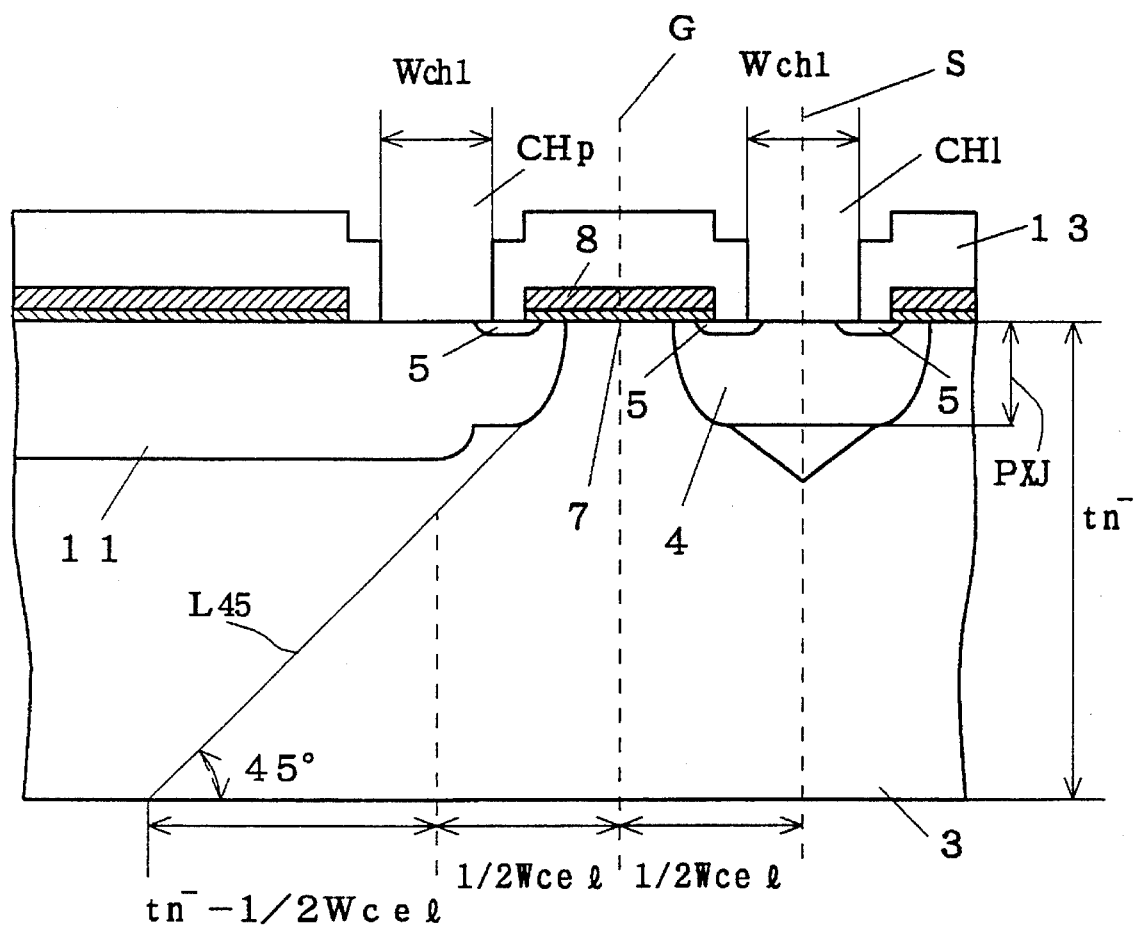
FIG. 38 is a fragmentary sectional view for delineating the operation of the conventional insulated gate semiconductor device.

In operation, when the IGBT in on, the contact resistance between the emitter electrode 9 and the $p^+$ semiconductor layer 12 is decreased to promote a hole current flow by providing the width $W_{ch2}$ of the contact hole $CH_P$ in the p type semiconductor region 11 which is large enough to permit the hole current in the region defined by the line $L_{45}$ of FIG. 38 indicative of the spreading of the carriers to pass through completely, and by providing the $p^+$ semiconductor layer 12 which is of higher concentration than the p type semiconductor region 11 and which is formed in the portion corresponding to the contact hole $CH_P$ of the p type semiconductor region 11. This prevents overcurrent from concentrating on the IGBT cell adjacent the p type semiconductor region 11 to prevent the stronger likelihood of the breakdown of the IGBT cell adjacent the p type semiconductor region 11 than that of other IGBT cells due to latch-up.

Further, during the ON-state to OFF-state transition of the IGBT, the contact resistance between the emitter electrode 9 and the $p^+$ semiconductor region 12 is decreased to promote the hole current flow by providing the width $W_{ch2}$ of the contact hole $CH_P$ which is large enough to meet rapid increase in hole current and by providing the $p^+$ semiconductor region 12 of higher concentration formed partially in the p type semiconductor region 11 in the portion corresponding to the contact hole $CH_P$ of the p type semiconductor region 11. This can remedy the situation in which part of the hole current does not completely pass through to the emitter electrodes 9 but flows into the IGBT cell adjacent the p type semiconductor region 11. Also prevented is the stronger likelihood of the breakdown of the IGBT cell adjacent the p type semiconductor region 11 than that of other IGBT cells due to latch-up.

Size reduction of the IGBT cells does not interfere with the formation of the $p^+$ semiconductor region 12 of higher concentration than the p type semiconductor region 11 in the surface of the p type semiconductor region 11 and the formation of the large width $W_{ch2}$ of the contact hole $CH_P$. Thus, if the width of the IGBT cells reduced in size is less than the thickness of the $n^-$ semiconductor layer 3 and more current flows in the contact hole $CH_P$ than in the contact hole $CH_1$, also prevented is the stronger likelihood of the breakdown of the IGBT cell adjacent the p type semiconductor region 11 than that of other IGBT cells due to latch-up.

<Fabrication Method>

Figure 11:
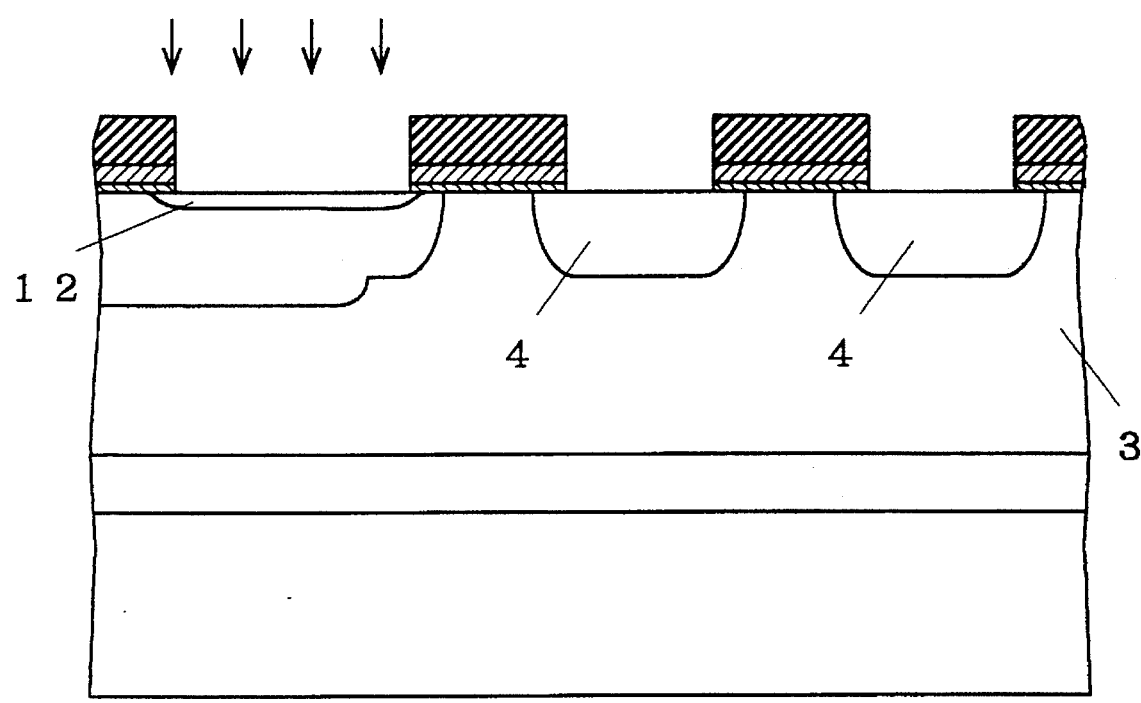
FIG. 11 is a sectional view showing a process step for fabrication of the insulated gate semiconductor device of the second preferred embodiment.

The method of fabricating the IGBT of FIG. 10 according to the second preferred embodiment is substantially similar to the method of the first preferred embodiment described with reference to FIGS. 4 to 9 except a difference in that p type impurities are implanted into the p type semiconductor region 11 between the gate electrodes 8 and annealed to partially form the $p^+$ semiconductor region 12 of higher concentration in the p type semiconductor region 11 in the process step of FIG. 11 between the process step of FIG. 7 wherein p type impurities are implanted from above the resist used in the previous process step and remaining on the gate electrodes 8 and are then annealed to form the p type base regions 4 between the gate electrodes 8 and the process step of FIG. 8 wherein the $n^+$ emitter regions 5 are formed. This results in triple diffusion of p type impurities in the p type semiconductor region 11.

Addition of the above-mentioned process step of FIG. 11 to the process steps described with reference to FIGS. 4 to 9 provides the IGBT shown in FIG. 10.

<Third Preferred Embodiment>

Description will be given on the insulated gate semiconductor device and the method of fabricating the same of a third preferred embodiment according to the present invention.

<Device Construction>

Figure 12:
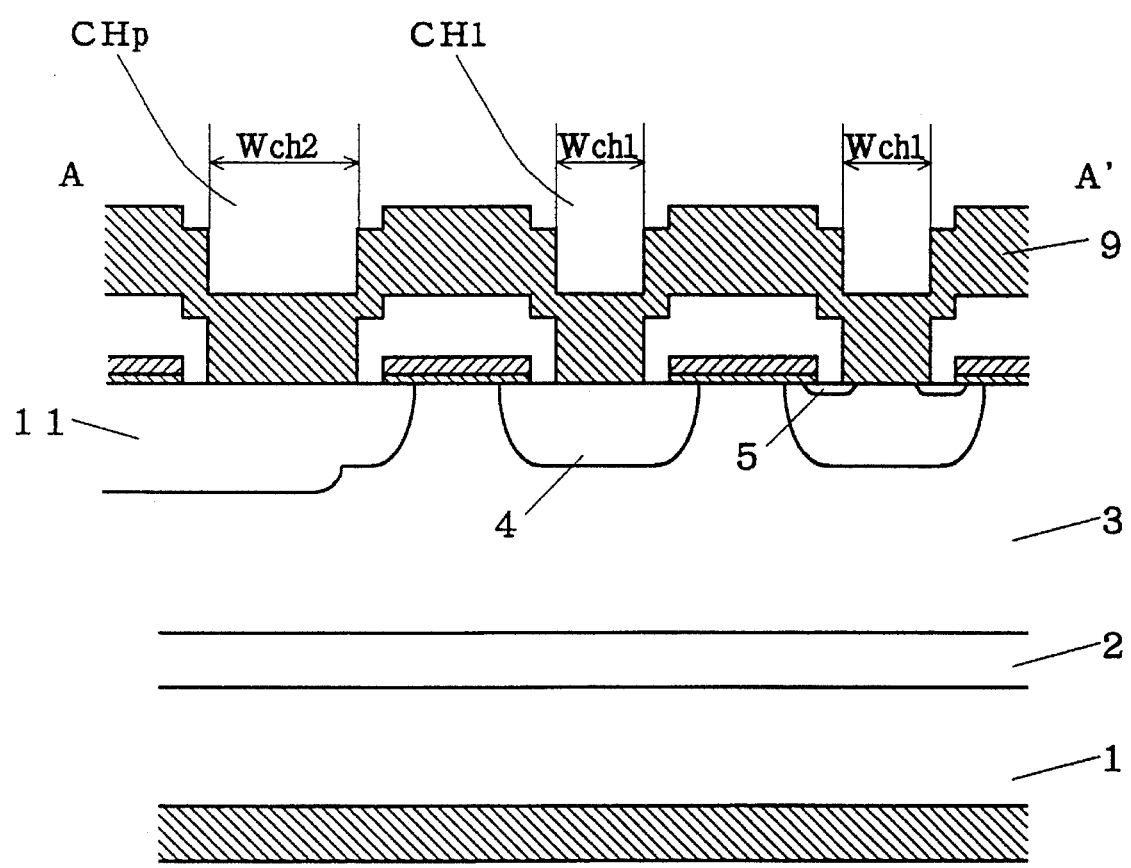
FIG. 12 is a fragmentary sectional view of the insulated gate semiconductor device of a third preferred embodiment according to the present invention.

The plan structure of the third preferred embodiment is similar to that of the first preferred embodiment shown in FIGS. 1 and 3. FIG. 12 illustrates a sectional structure taken along the line A–A' of FIGS. 1 and 3.

FIG. 12 illustrates the IGBT cells described with reference to FIG. 32 which are arranged in parallel such that the emitter electrodes 9 are connected to the upper surfaces of the p type base regions 4 and $n^+$ emitter regions 5 of the respective IGBT cells through the contact holes $CH_1$ having the width $W_{ch1}$. In a portion adjacent the side A of FIG. 12, the p type semiconductor region 11 is formed in the surface of the $n^-$ semiconductor layer 3 by double diffusion. The contact hole $CH_P$ having the width $W_{ch2}$ greater than the width $W_{ch1}$ is formed on the top surface above the p type semiconductor region 11, and the emitter electrode 9 is connected to the p type semiconductor region 11 through the contact hole $CH_P$. In FIG. 12, the $n^+$ emitter regions 5 are not formed in the IGBT cell adjacent the p type semiconductor region 11. Like reference numerals and characters are used to designate parts identical with those of FIG. 35.

In operation, when the IGBT is on, the width $W_{ch2}$ of the contact hole $CH_P$ in the p type semiconductor region 11 which is large enough to permit the hole current in the region defined by the line $L_{45}$ of FIG. 38 indicative of the spreading of the carriers to pass through completely, prevents overcurrent from concentrating on the IGBT cell adjacent the p type semiconductor region 11. Further, the absence of the $n^+$ emitter regions 5 in the IGBT cell adjacent the p type semiconductor region 11 provides no parasitic thyristor consisting of the $n^+$ emitter region 5, the p type base region 4, the $n^-$ semiconductor layer 3 and the $p^+$ semiconductor layer 1. If overcurrent concentrates on the IGBT cell adjacent the p type semiconductor region 11, the IGBT breakdown due to IGBT latch-up resulting from turning on of the parasitic thyristor is prevented.

Further, during the ON-state to OFF-state transition of the IGBT, the width $W_{ch2}$ of the contact hole $CH_P$ which is large enough to meet rapid increase in hole current can remedy the situation in which part of the hole current does not completely pass through to the emitter electrodes 9 but flows into the IGBT cell adjacent the p type semiconductor region 11. Further, the absence of the $n^+$ emitter regions 5 in the IGBT cell adjacent the p type semiconductor region 11 provides no parasitic thyristor consisting of the $n^+$ emitter region 5, the p type base region 4, the $n^-$ semiconductor layer 3 and the $p^+$ semiconductor layer 1. If overcurrent concentrates on the IGBT cell adjacent the p type semiconductor region 11, the IGBT breakdown due to IGBT latch-up resulting from turning on of the parasitic thyristor is prevented.

Size reduction of the IGBT cells does not interfere with the formation of the large width $W_{ch2}$ of the contact hole $CH_P$ in the p type semiconductor region 11 and the formation of the IGBT cell having no $n^+$ emitter regions 5. Thus, if the width of the IGBT cells reduced in size is less than the thickness of the $n^-$ semiconductor layer 3 and more current flows in the contact hole $CH_P$ than in the contact hole $CH_1$, reduced is the likelihood of the breakdown of the IGBT cell adjacent the p type semiconductor region 11 due to latch-up as compared with that of other IGBT cells. The IGBT breakdown due to IGBT latch-up resulting from turning on of the parasitic thyristor is prevented if overcurrent concentrates on the IGBT cell adjacent the p type semiconductor region 11.

<Fabrication Method>

Figure 13:
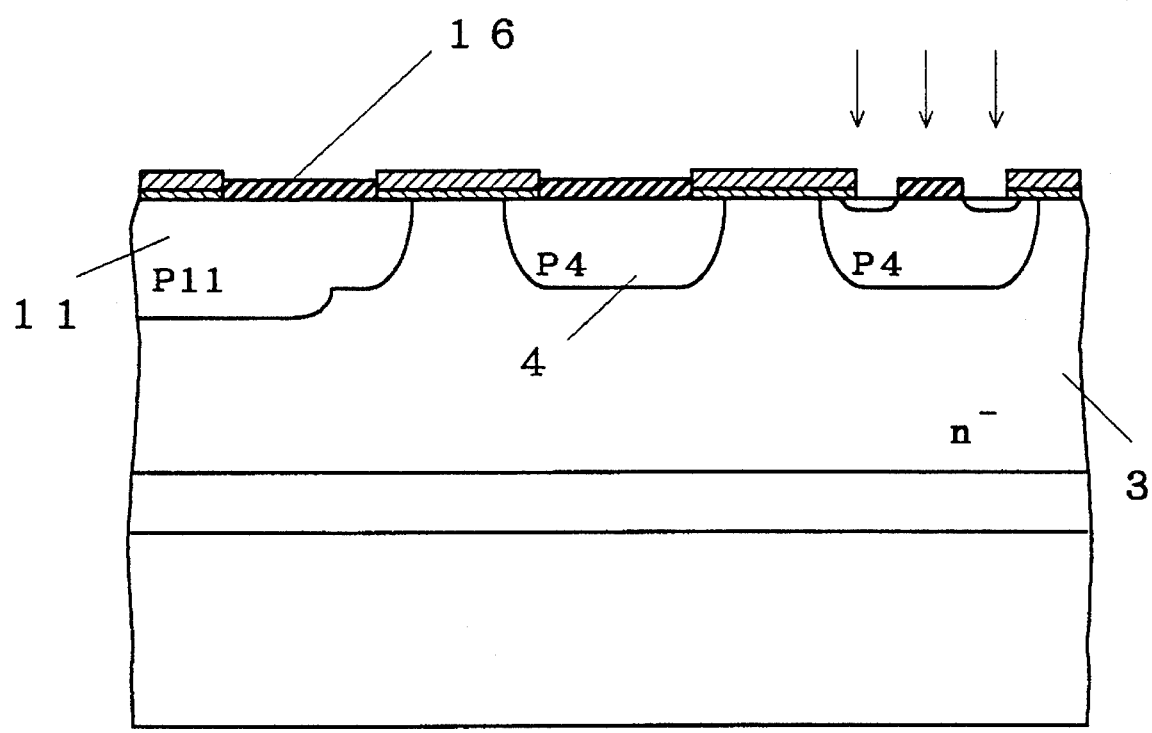
FIG. 13 is a sectional view showing a process step for fabrication of the insulated gate semiconductor device of the third preferred embodiment.

The method of fabricating the IGBT of FIG. 12 according to the third preferred embodiment is substantially similar to the method of the first preferred embodiment described with reference to FIGS. 4 to 9 except a difference in that n type impurities (e.g., arsenic) are implanted using the implantation mask 16 having a pattern which does not form the $n^+$ emitter regions 5 adjacent the p type semiconductor region 11 as shown in FIG. 13 in the process step of forming the $n^+$ emitter regions 5.

Replacing the process step of FIG. 7 with the process step of FIG. 13 in the method of fabricating the IGBT of the first preferred embodiment described with reference to FIGS. 4 to 9 provides the IGBT shown in FIG. 12.

<Fourth Preferred Embodiment>

An IGBT having the advantages of both the second and third preferred embodiments is achieved by combination of the features of the second and third preferred embodiments, that is, by a structure wherein the $p^+$ semiconductor layer 12 of higher concentration than the p type semiconductor region 11 is formed partially in the surface of the p type semiconductor region 11 and the $n^+$ emitter regions 5 are not formed in the IGBT cell adjacent the p type semiconductor region <Fifth Preferred Embodiment>

Description will be given on the insulated gate semiconductor device and the method of fabricating the same of a fifth preferred embodiment according to the present invention.

<Device Construction>

Figure 14:
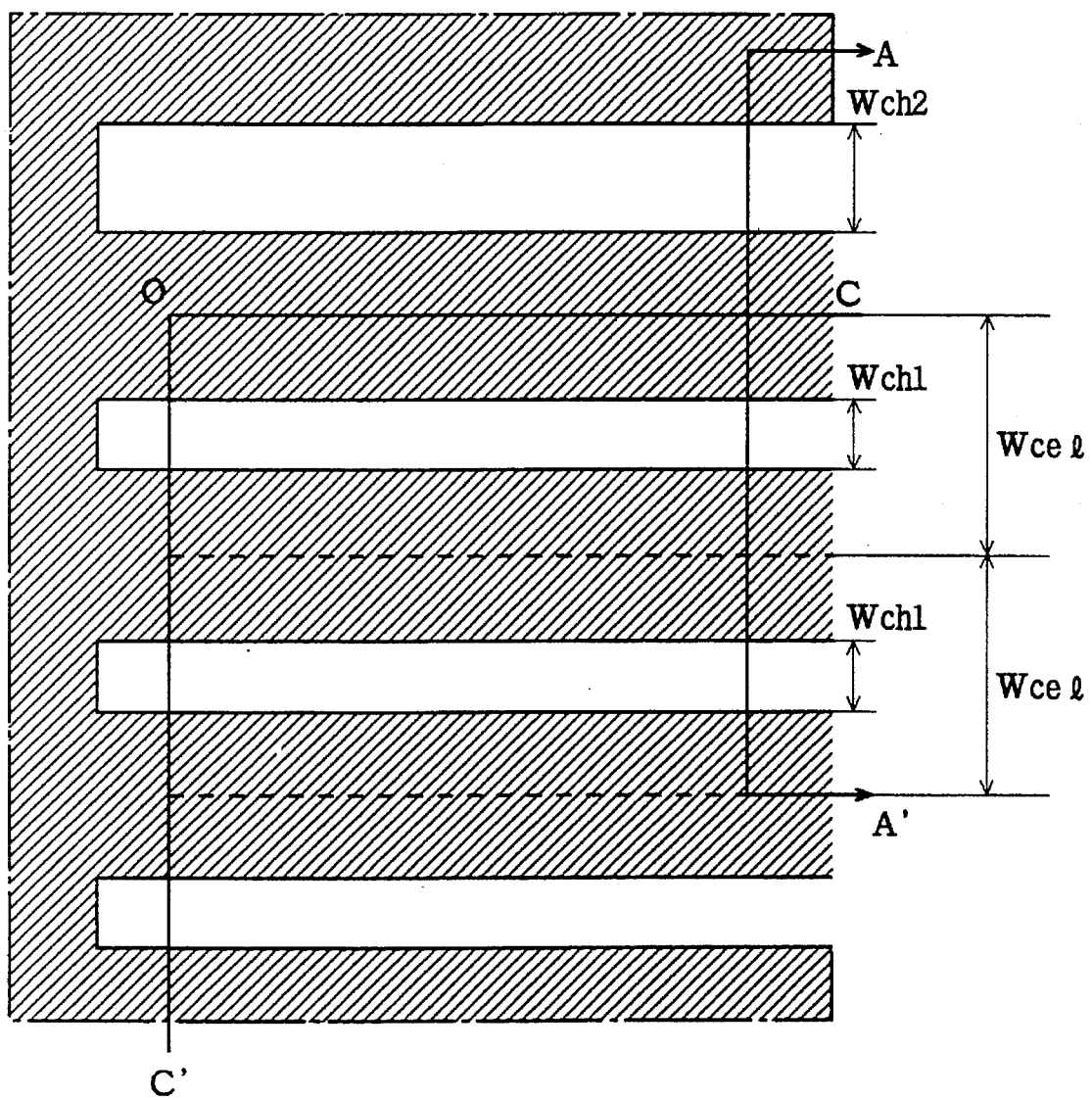
FIG. 14 is a fragmentary plan view of the insulated gate semiconductor device of a fifth preferred embodiment according to the present invention.
Figure 15:
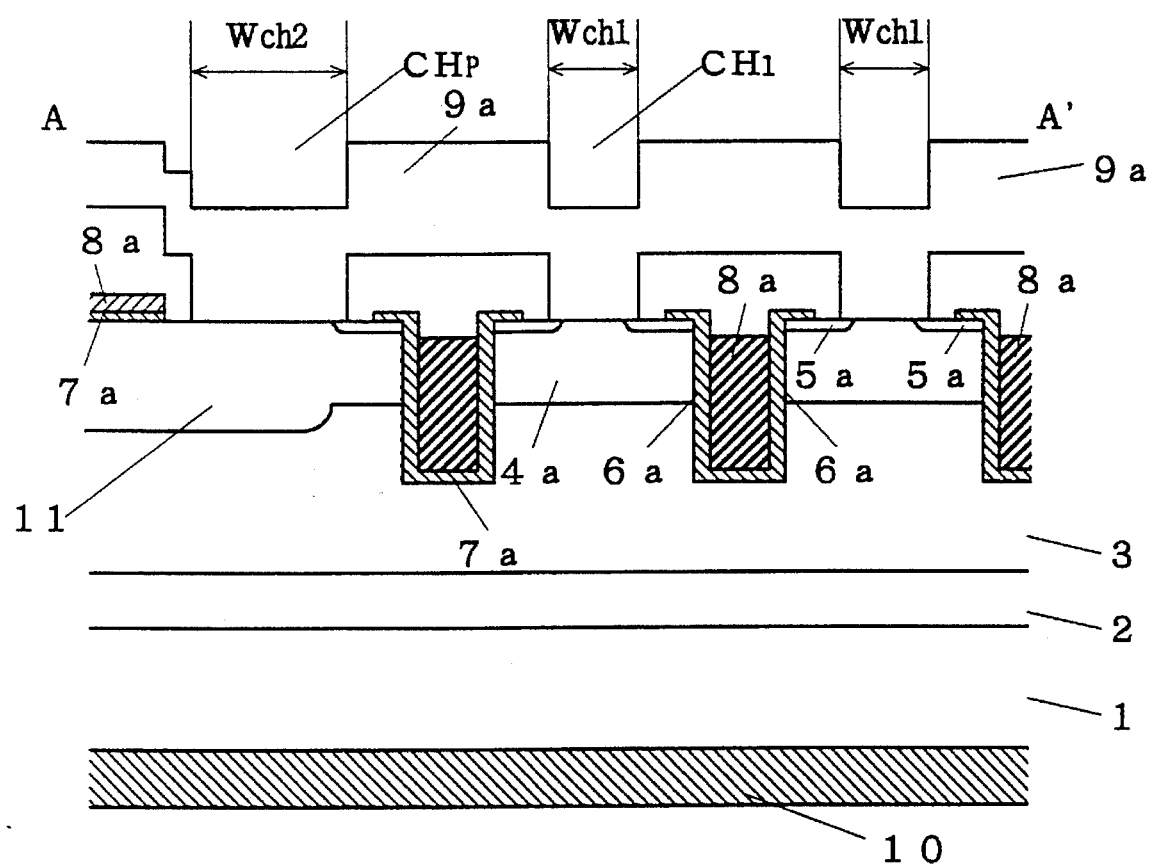
FIG. 15 is a fragmentary sectional view of the insulated gate semiconductor device of the fifth preferred embodiment.

The plan structure of the fifth preferred embodiment is similar to that of FIG. 33. FIG. 14 is an enlarged view of a portion corresponding to the region X enclosed by the dashed-and-dotted lines of FIG. 33. Referring to FIG. 14, the stripe-shaped IGBT cells each including the contact hole $CH_1$ having the width $W_{ch1}$ are spaced the constant distance $W_{cel}$ from each other in parallel inside the corner portion indicated by the lines C–O–C'. The p type semiconductor region 11 including the stripe-shaped contact hole $CH_P$ having the width $W_{ch2}$ is formed outside the corner portion indicated by the lines C–O–C'. FIG. 15 is a sectional view taken along the line A–A' of FIG. 14.

Figure 16:
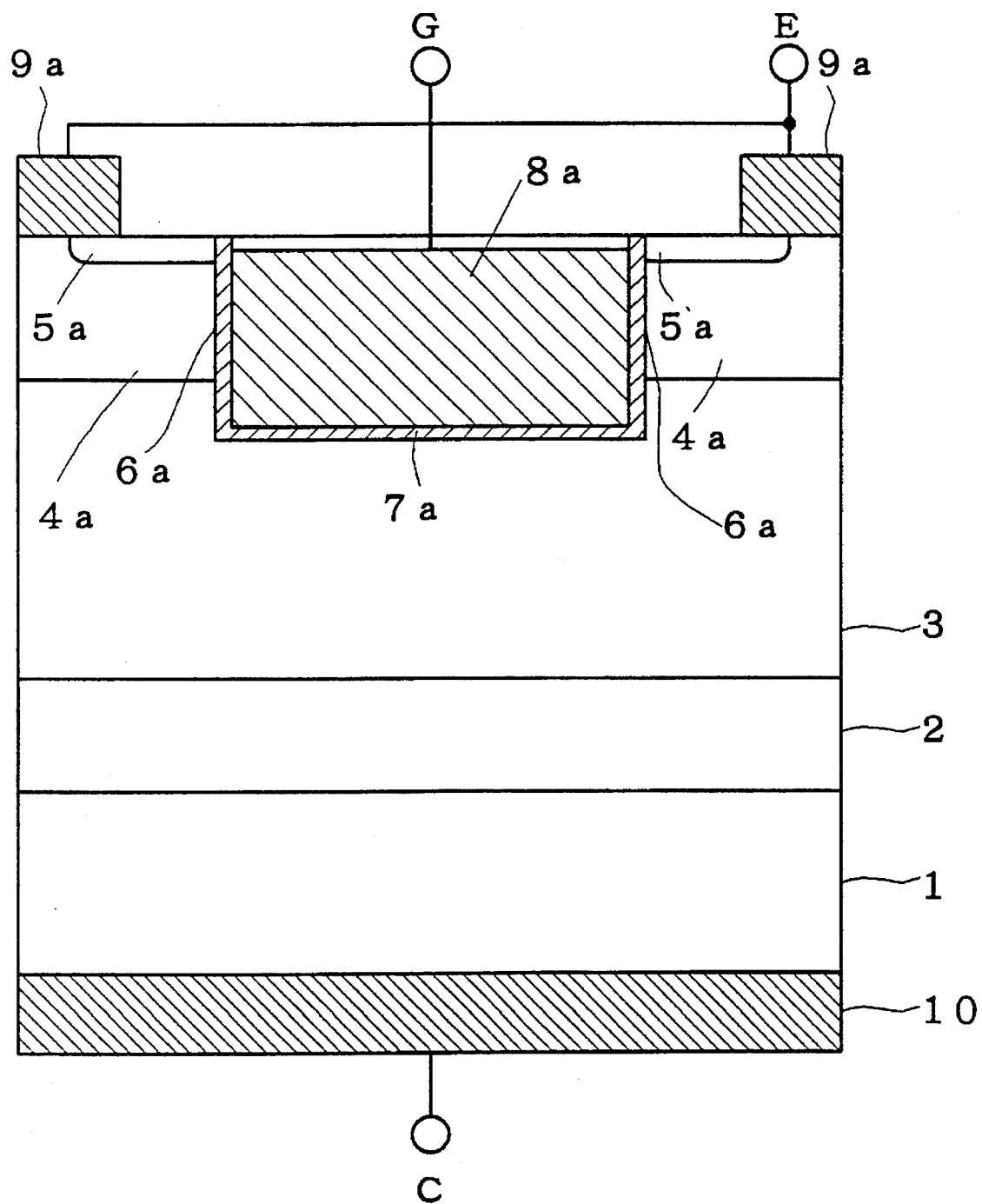
FIG. 16 is a sectional view showing a basic structure of the insulated gate semiconductor device.

The basic structure of the IGBT cells of the fifth preferred embodiment is different from that of the background art described with reference to FIG. 32 and the first to third preferred embodiments. FIG. 16 illustrates the basic structure of an IGBT cell according to the fifth preferred embodiment. This type of IGBT cell is generally well know in the art and is referred to as a U-shaped IGBT.

Figure 32:
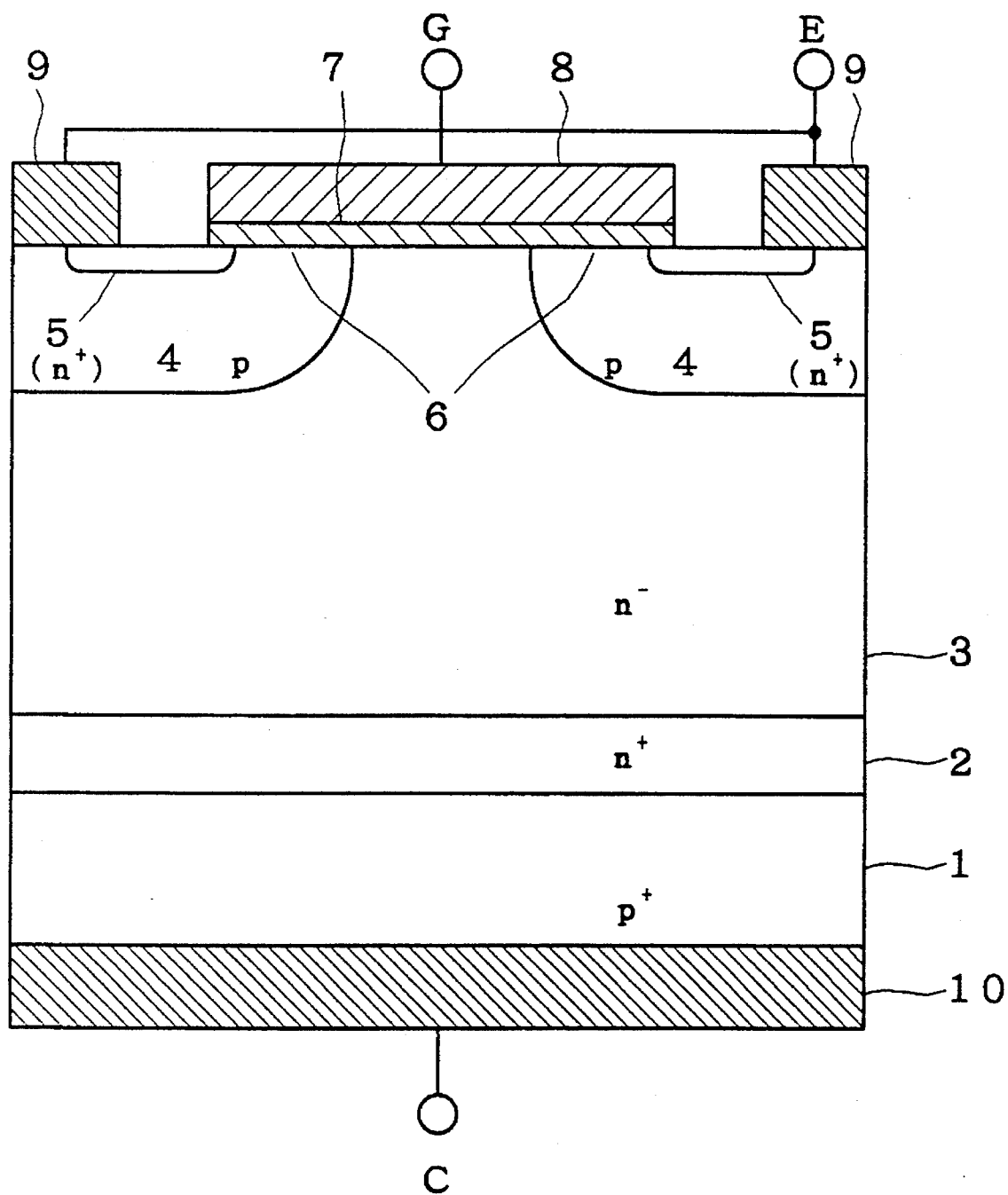
FIG. 32, is a sectional view showing a basic structure of the insulated gate semiconductor device.

Similar to the conventional IGBT cell of FIG. 32, the U-shaped IGBT cell of FIG. 16 comprises the p⁺ semiconductor layer 1 formed of the p type semiconductor substrate and having first and second major surfaces; the n⁺ buffer layer 2 formed on the first major surface of the p⁺ semiconductor layer 1; the n⁻ semiconductor layer 3 formed over the n⁺ buffer layer 2; p type base regions 4a formed on an upper surface of the n⁻ semiconductor layer 3 by diffusion of p type impurities; and n⁺ emitter regions 5a formed in a partial region of the p type base regions 4a by selective diffusion of a high concentration of n type impurities. A groove is formed extending through the n⁺ emitter regions 5a and p type base regions 4a into the n⁻ semiconductor layer 3. A gale insulation film 7a is formed along an inner wall surface of the groove, and a gate electrode 8a made of, for example, polycrystalline silicon is buried in the interior of the gate insulation film 7a. The fifth preferred embodiment is similar to the first to fourth preferred embodiments in that the gate electrode 8a is formed in opposed relation to a surface of the p type base regions 4a.

Emitter electrodes 9a made of, for example, aluminum are formed over the respective tipper surfaces of the p type base regions 4a and n⁺ emitter regions 5a. The gate electrode 8a and the emitter electrodes 9a are insulated from each other. Gate electrodes 8a for all IGBT cells are connected to each other, and emitter electrodes 9a for all IGBT cells are connected to each other.

The collector electrode 10 made of, for example, aluminum is formed on the second major surface of the p⁺ semiconductor layer 1. The collector electrode 10 is formed integrally for all IGBT cells.

in operation, similar to the operation of the conventional IGBT cell of FIG. 32, when a gate voltage $V_{GE}$ exceeding a threshold value is applied between the emitter electrodes 9a and the gate electrode 8a, channel regions 6a in a surface of the p type base regions 4a which lies between the surface of the n⁻ semiconductor layer 3 and the surface of the n⁺ emitter regions 5a are inverted into n type, and n type channels are formed in the channel regions 6a. Electrons as carriers are emitted from the emitter electrodes 9a through the n type channels into the n⁻ semiconductor layer 3. Then the IGBT turns on.

The U-shaped IGBT cell is further reduced in size as compared with the IGBT cells of the first to fourth preferred embodiments and is readily improved in degree of integration. The process steps for fabrication are simplified in the fifth preferred embodiment since the p type base region 4a should be formed entirely over the upper surface of the n⁻ semiconductor layer 3 rather than being selectively formed.

FIG. 15 illustrates the above stated U-shaped IGBT cells arranged in parallel such that the emitter electrodes 9a are connected to the upper surfaces of the p type base regions 4a and n⁺ emitter regions 5a of the respective U-shaped IGBT cells through the contact holes $CH_1$ having the width $W_{ch1}$.

A portion adjacent the side A of FIG. 15 represents a region outside the line C–O of the corner portion indicated by the lines C–O–C' of FIG. 14 wherein the p type semiconductor region 11 is formed in the surface of the n⁻ semiconductor layer 3 by double diffusion in corresponding relation to the p type base region 4a of the adjacent IGBT cell and the emitter electrode 9 is connected to the upper surface of the p type semiconductor region 11 through the contact hole $CH_P$ having the width $W_{ch2}$ greater than the width $W_{ch1}$ of the contact hole $CH_1$. Like reference numerals and characters are used to designate parts identical with those of FIG. 35.

In operation, the U-shaped IGBT constructed as shown in FIG. 16 is adapted such that holes supplied from the p⁺ semiconductor layer 1 directly below the p type semiconductor region 11 pass through the contact hole $CH_P$ having the width $W_{ch2}$ in the p type semiconductor region 11 to the emitter electrodes 9a when the IGBT is on. In this case, if the width $W_{ch2}$ of the contact hole $CH_P$ in the p type semiconductor region 11 is sufficiently large, overcurrent does not concentrate on the IGBT cell adjacent the p type semiconductor region 11 to prevent the stronger likelihood of the breakdown of the IGBT cell adjacent the p type semiconductor region 11 than that of other IGBT cells due to latch-up.

Further, during the ON-state to OFF-state transition of the IGBT, formation of the contact hole $CH_P$ having the width $W_{ch2}$ which is large enough to meet rapid increase in hole current can remedy the situation in which part of the hole current does not completely pass through to the emitter electrodes 9a but flows into the IGBT cell adjacent the p type semiconductor region 11. This also prevent the stronger likelihood of the breakdown of the IGBT cell adjacent the p type semiconductor region 11 than that of other IGBT cells due to latch-up.

In the fifth preferred embodiment, size reduction of the IGBT cells does not interfere with the large width $W_{ch2}$ of the contact hole $CH_P$ in the p type semiconductor region 11. Thus, if the width of the IGBT cells reduced in size is less than the thickness of the n⁻ semiconductor layer 3 and more current flows in the contact hole $CH_P$ than in the contact hole $CH_1$, also prevented is the stronger likelihood of the breakdown of the IGBT cell adjacent the p type semiconductor region 11 than that of other IGBT cells due to latch-up.

<Another Application>

Figure 17:
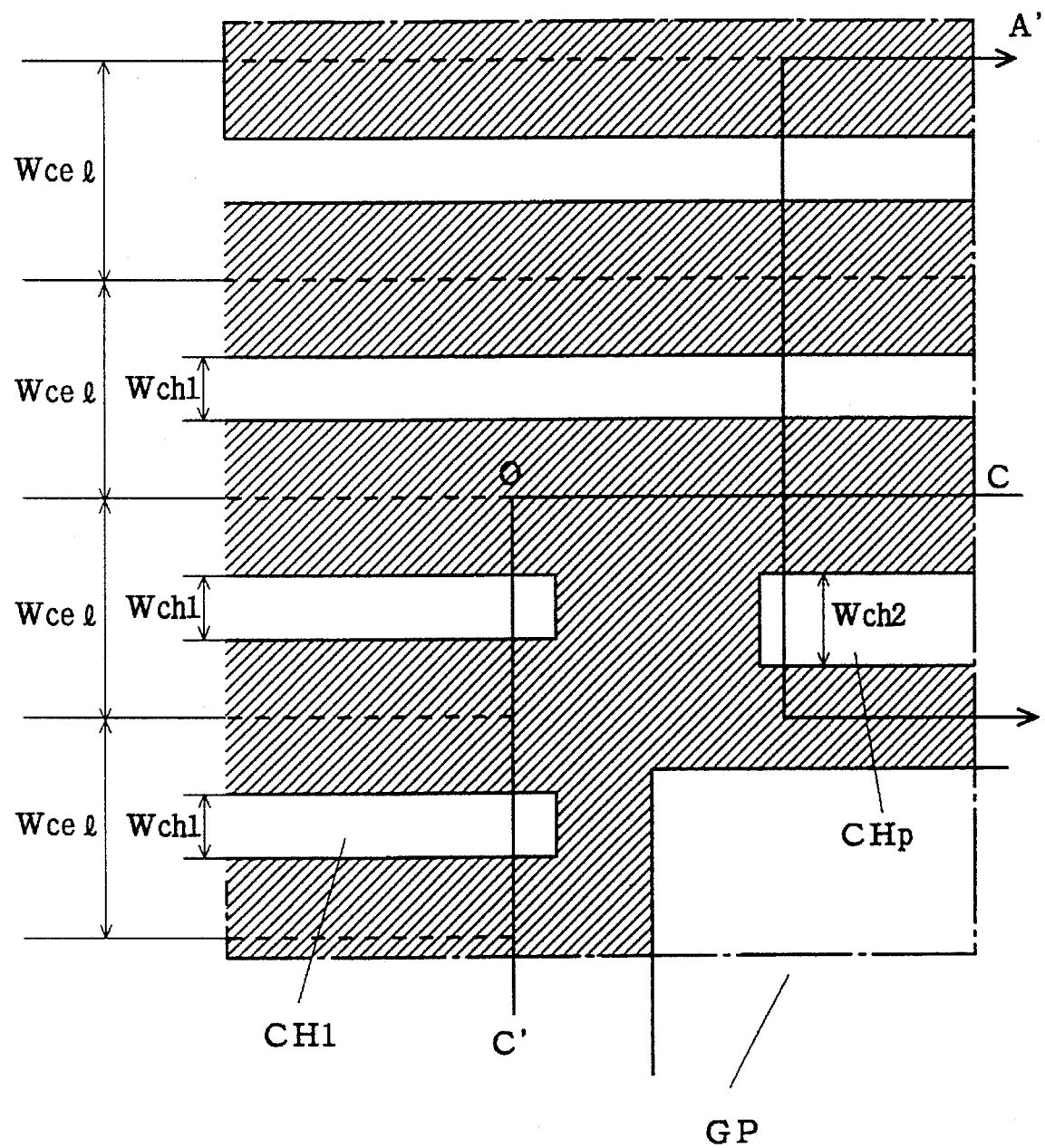
FIG. 17, is a fragmentary plan view of the insulated gate semiconductor device of the firth prepared embodiment.
Figure 18:
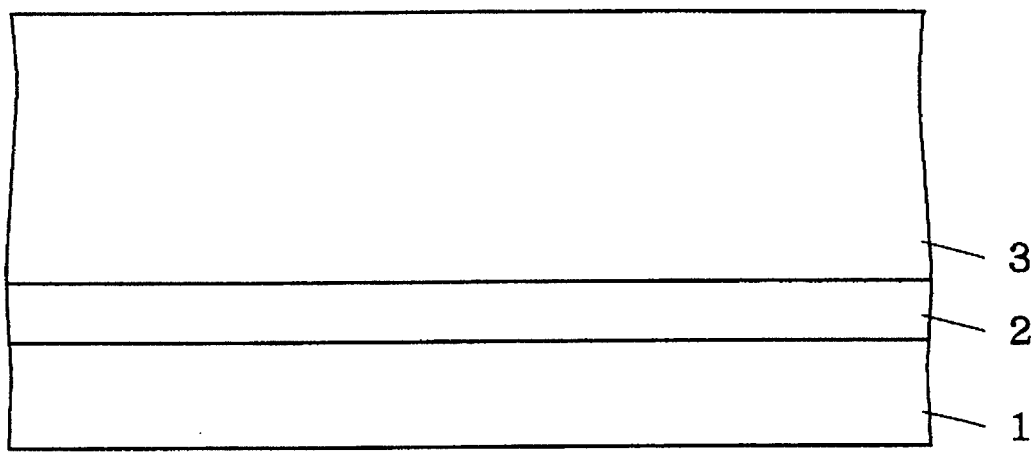
FIGS. 18 to 25 are sectional views showing process steps for fabrication of the insulated gate semiconductor device of the fifth preferred embodiment.

The region X enclosed by the dashed-and-dotted lines of FIG. 33 is described hereinabove. The region Y enclosed by the dashed-and-doted lines of FIG. 33 will be discussed below. FIG. 17 is an enlarged view of the region Y. Referring to FIG. 17, the gate pad GP adjacent the corner portion is formed perpendicularly to the IGBT cells, which causes the p type semiconductor region 11 to protrude to form a recessed IGBT cell region. This preferred embodiment provides the contact hole $CH_P$ wider than the contact hole $CH_1$ in the protruding p type semiconductor region 11 parallel to the IGBT cells without changing the arrangement of the IGBT cells and permits contact between the emitter electrodes 9 and the p type semiconductor region 11 through the contact hole $CH_P$.

With continued reference to FIG. 17, the stripe-shaped IGBT cells each including the contact hole $CH_1$ having the width $W_{ch1}$ are spaced the constant distance $W_{cel}$ from each other in parallel outside the corner portion indicated by the lines C–O–C'. The p type semiconductor region 11 including the stripe-shaped contact hole $CH_P$ having the width $W_{ch2}$ is formed inside the corner portion indicated by the lines C–O–C'. The section taken along the line A–A' of FIG. 17 is similar to that of FIG. 15.

In operation, this application exhibits effects when the IGBT is on, when the IGBT makes the ON-state to OFF-state transition, and when the IGBT cells are reduced in size, similar to the application of this preferred embodiment to the region X.

<Fabrication Method>

FIGS. 18 to 25 are sectional views showing process steps for fabrication of the IGBT of FIG. 15 in sequential order. In the process step shown in FIG. 18, the $p^+$ semiconductor layer 1 serving as a substrate (e.g., a single crystal Si substrate) is prepared. The $n^+$ buffer layer 2 and the $n^-$ semiconductor layer 3 are sequentially formed on the first major surface of the $p^+$ semiconductor layer 1 by epitaxial growth technique.

Figure 19:
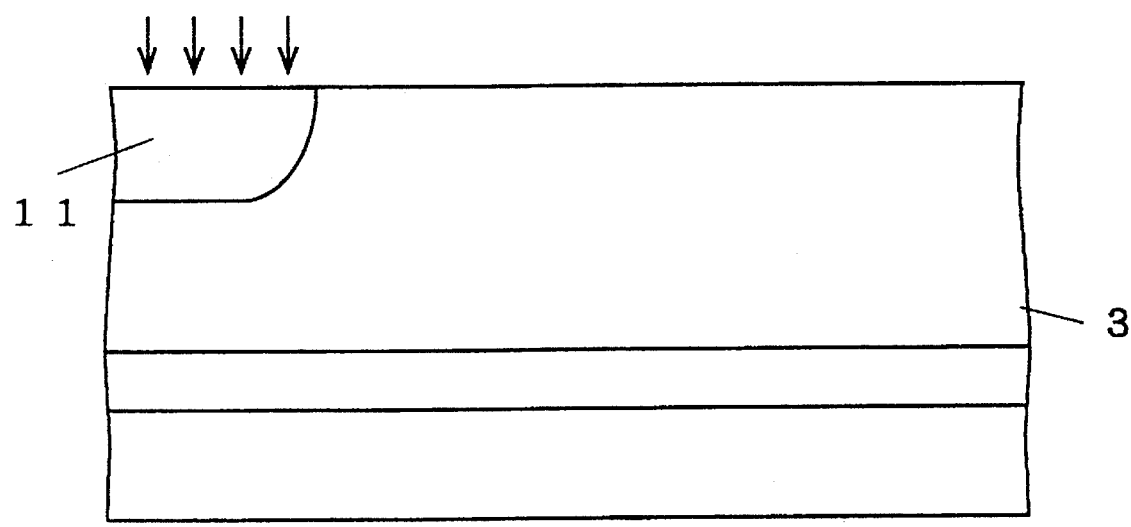

In the process step shown in FIG. 19, p type impurities (e.g., boron) are implanted into a predetermined portion of the $n^-$ semiconductor layer 3 and are then annealed to form the p type semiconductor region 11.

Figure 20:
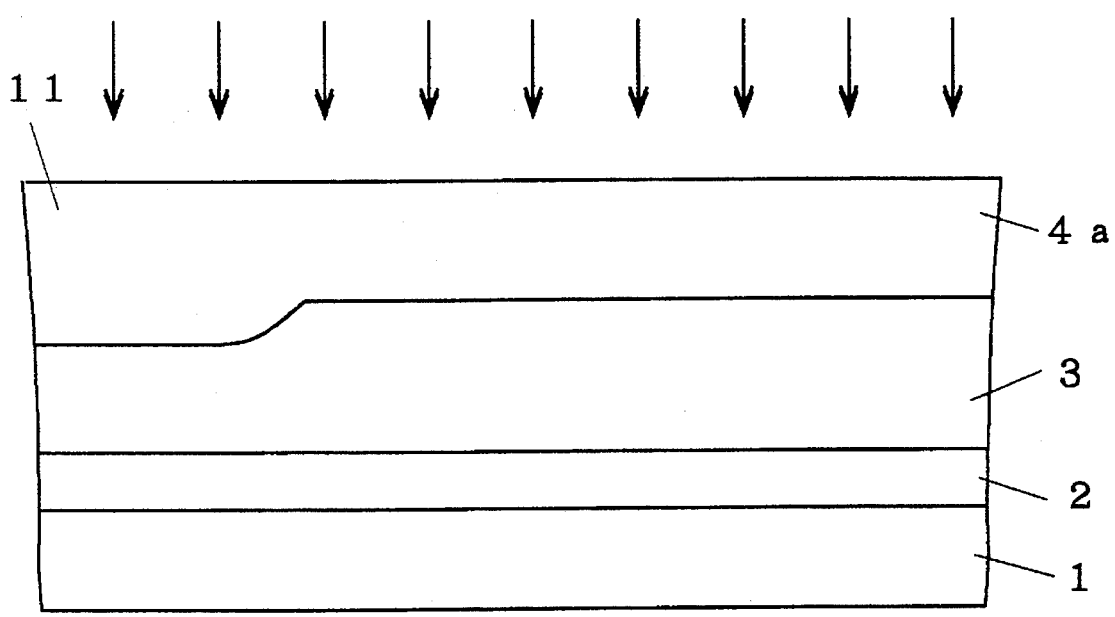

In the process step shown in FIG. 20, p type impurities are implanted into the entire surface of the $n^-$ semiconductor layer 3 and are then annealed to form the p type base region 4a. This results in double diffusion of p type impurities in the p type semiconductor region 11.

Figure 21:
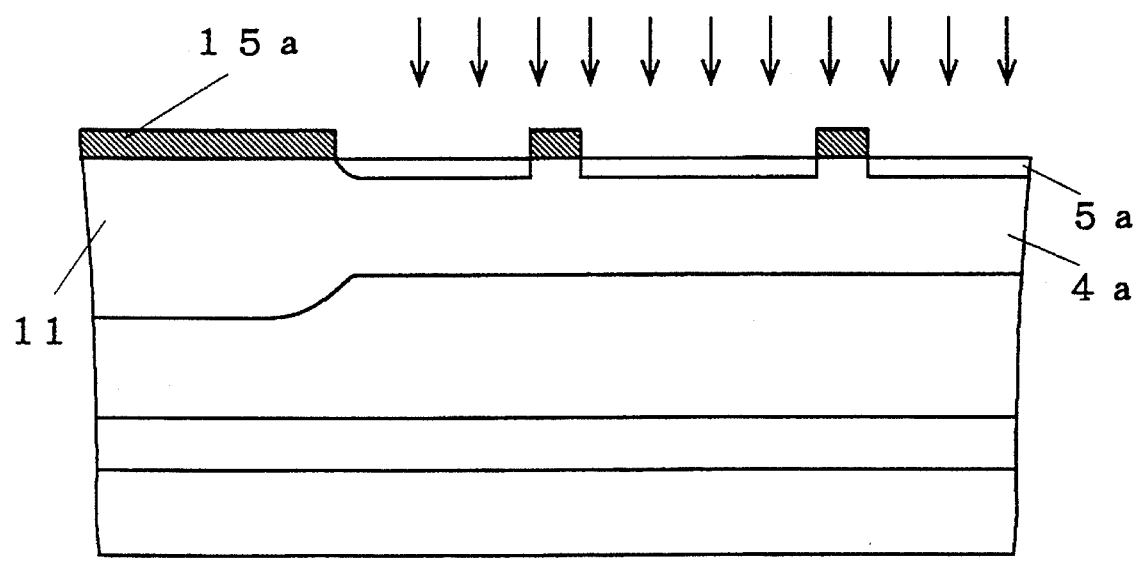

In the process step shown in FIG. 21, n type impurities (e.g., arsenic) are selectively implanted into a predetermined portion of the p type base region 4a by using an implantation mask 15a having a desired pattern and are then annealed to form the $n^+$ emitter regions 5a.

Figure 22:
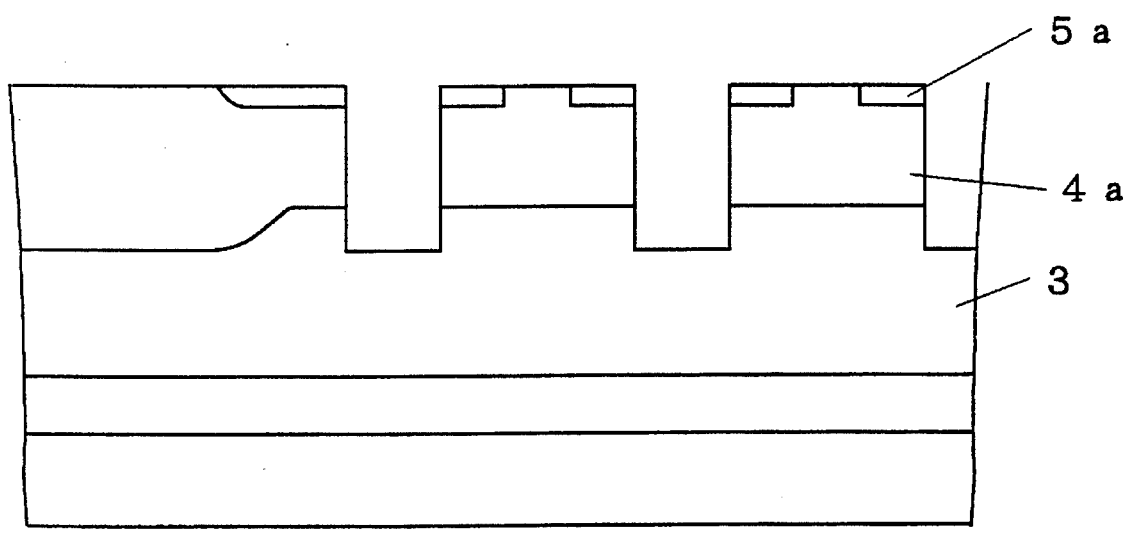

In the process step shown in FIG. 22, selective silicon etching is performed on the $n^+$ emitter regions 5a, the p type base region 4a, and the $n^-$ semiconductor layer 3 by means of RIE (reactive ion etching) technique to form stripe-shaped grooves in desired positions.

Figure 23:
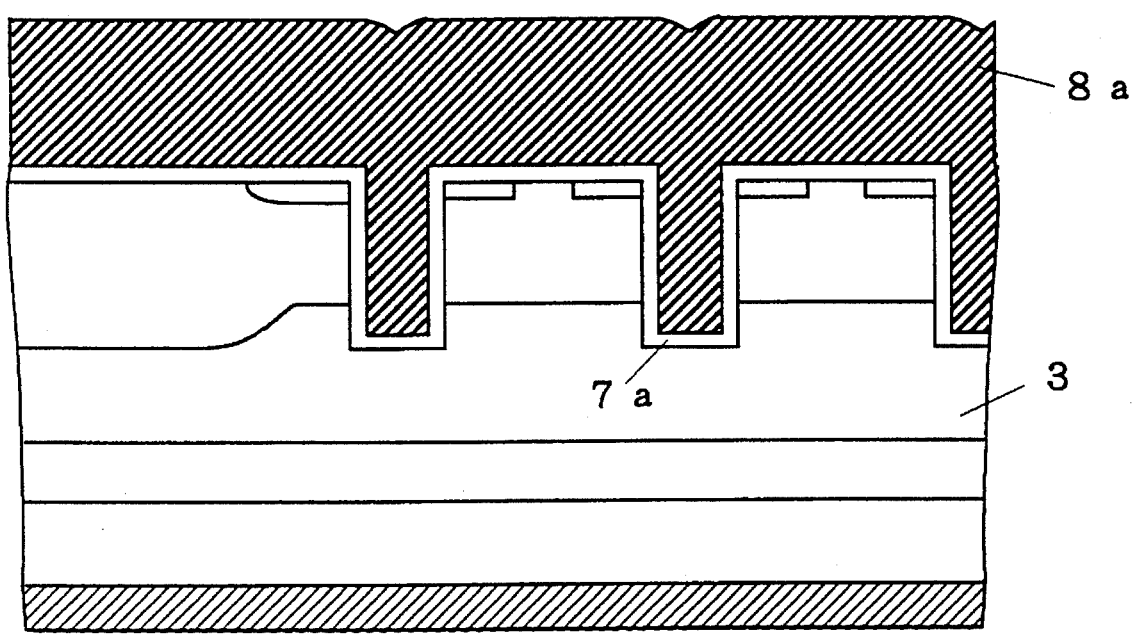

In the process step shown in FIG. 23, the gate insulation film 7a such as a thermal oxidation film is formed over the tipper surfaces of the p type semiconductor region 11 and $n^+$ emitter regions 5a and the inner surfaces of the grooves formed in the foregoing process step. Doped polysilicon is deposited on the gate insulation film 7a so as to be buried in the grooves formed in the foregoing process step to form the gate electrode 8a.

Figure 24:
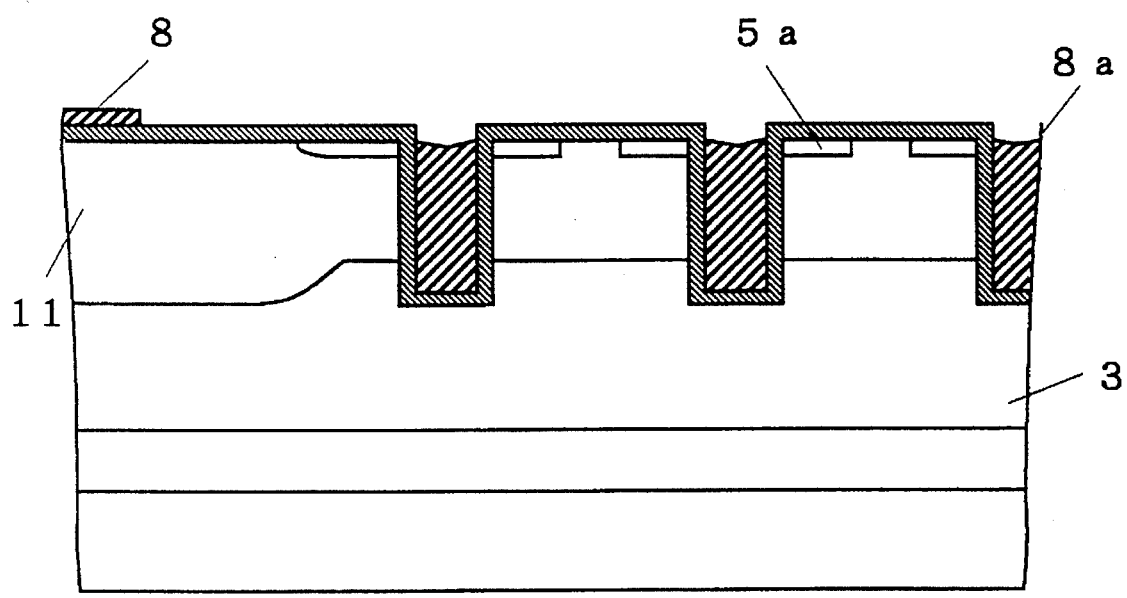

In the process step shown in FIG. 24, unnecessary doped silicon except that lying in a predetermined position above the p type semiconductor region 11 and that buried in the grooves is etched back by the RIE technique.

Figure 25:
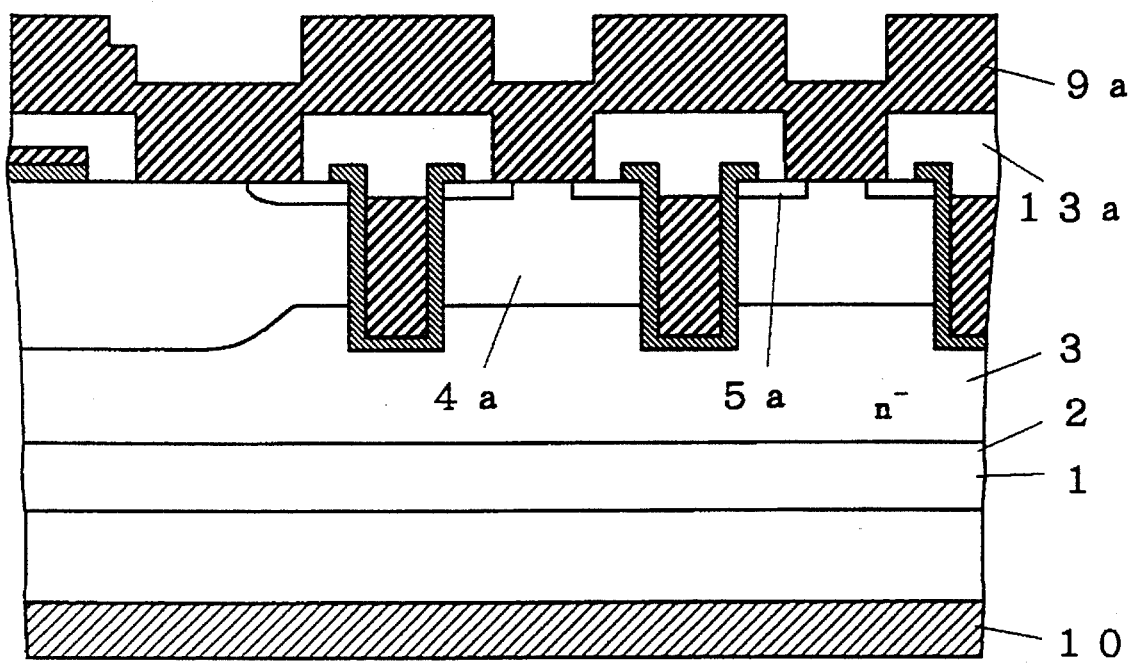

In the process step shown in FIG. 25, the gate insulating film 7a is selectively etched, and the layer insulation films 13 made of, for example, PSG (phosphosilicate glass) are formed on the gate electrodes 8a and the remaining gate insulating films 7a. Then the emitter electrodes 9a made of, for example, aluminum are formed over the upper surfaces of the p type base regions 4a and $n^+$ emitter regions 5a between the layer insulation films 13. Emitter electrodes 9a for all IGBT cells are connected to each other. Finally, the collector electrode 10 made of, for example, aluminum is formed over the second major surface of the $p^+$ semiconductor layer 1 integrally for all IGBT cells. This completes the IGBT of FIG. 15.

<Sixth Preferred Embodiment>

Description will be given on the insulated gate semiconductor device and the method of fabricating the same of a sixth preferred embodiment according to the present invention.

<Device Construction>

Figure 26:
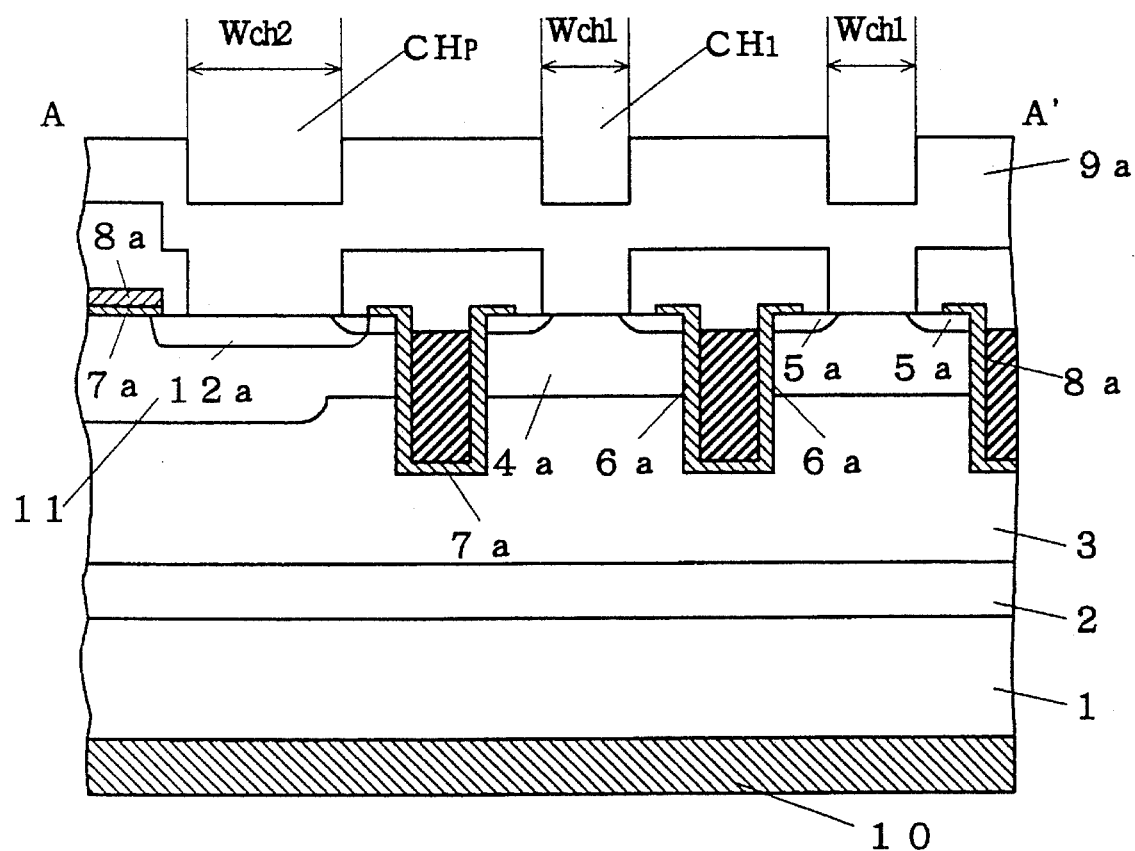
FIG. 26 is a fragmentary sectional view of the insulated gate semiconductor device of a sixth preferred embodiment according to the present invention.

The plan structure of the sixth preferred embodiment is similar to that of the fifth preferred embodiment shown in FIGS. 14 and 17. FIG. 26 illustrates a sectional structure taken along the line A-A' of FIGS. 14 and 17.

FIG. 26 illustrates the U-shaped IGBT cells described with reference to FIG. 16 which are arranged in parallel such that the emitter electrodes 9a are connected to the upper surfaces of the p type base regions 4a and $n^+$ emitter regions 5a of the respective IGBT cells through the contact holes $CH_1$ having the width $W_{ch1}$. In a portion adjacent the side A of FIG. 26, the p type semiconductor region 11 is formed in the surface of the $n^-$ semiconductor layer 3 by double diffusion in corresponding relation to the p type base regions 4 of the IGBT cells, and a $p^+$ semiconductor layer 12a having a higher concentration than that of the p type semiconductor region 11 is formed partially in a surface of the p type semiconductor region 11. The contact hole $CH_P$ having the width $W_{ch2}$ greater than the width $W_{ch1}$ of the contact holes $CH_1$ is formed on the top surface above the $p^+$ semiconductor layer 12a, and the emitter electrode 9a is connected to the $p^+$ semiconductor layer 12a through the contact hole $CH_P$. Like reference numerals and characters are used to designate parts identical with those of FIG. 35.

In operation, when the IGBT in on, the contact resistance between the emitter electrode 9a to and the $p^+$ semiconductor layer 12a is decreased to promote a hole current flow by providing the sufficiently large width $W_{ch2}$ of the contact hole $CH_P$ in the p type semiconductor region 11 and the $p^+$ semiconductor layer 12a of higher concentration than the p type semiconductor region 11 in the portion corresponding to the contact hole $CH_P$ of the p type semiconductor region 11. This prevents overcurrent from concentrating on the IGBT cell adjacent the p type semiconductor region 11 to prevent the stronger likelihood of the breakdown of the IGBT cell adjacent the p type semiconductor region 11 than that of other IGBT cells due to latch-up.

Further, during the ON-state to OFF-state transition of the IGBT, the contact resistance between the emitter electrode 9 and the $p^+$ semiconductor layer 12a is decreased to promote the hole current flow by providing the width $W_{ch2}$ of the contact hole $CH_P$, which is large enough to meet rapid increase in hole current and by providing the $p^+$ semiconductor layer 12a of higher concentration than the p type semiconductor region 11 and formed partially in the portion corresponding to the contact hole $CH_P$, of the p type semiconductor region 11. This can remedy the situation in which part of the hole current does not completely pass through to the emitter electrodes 9a but flows into the IGBT cell adjacent the p type semiconductor region 11. Also prevented is the stronger likelihood of the breakdown of the IGBT cell adjacent the p type semiconductor region 11 than that of other IGBT cells due to latch-up.

Size reduction of the IGBT cells does not interfere with the formation of the $p^+$ semiconductor region 12a of higher concentration than the p type semiconductor region 11 in the surface of the p type semiconductor region 11 and the formation of the large width $W_{ch2}$ of the contact hole $CH_P$. Thus, if the width of the IGBT cells reduced in size is less than the thickness of the $n^-$ semiconductor layer 3 and more current flows in the contact hole $CH_P$ than in the contact hole $CH_1$, also prevented is the stronger likelihood of the breakdown of the IGBT cell adjacent the p type semiconductor region 11 than that of other IGBT cells due to latch-up.

<Fabrication Method>

Figure 27:
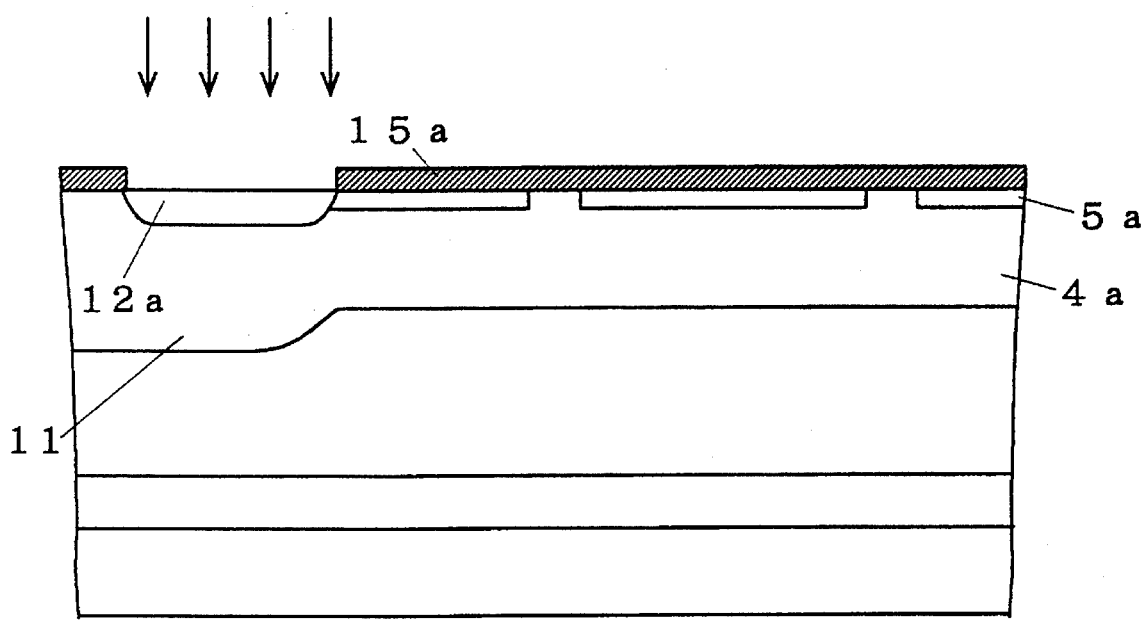
FIG. 27 is a sectional view showing a process step for fabrication of the insulated; gate semiconductor device of the sixth preferred embodiment.

The method of fabricating the IGBT of FIG. 26 according to the sixth preferred embodiment is substantially similar to the method of the fifth preferred embodiment described with reference to FIGS. 18 to 25 except a difference in that p type impurities are implanted into the p type semiconductor region 11 in a predetermined position and annealed to partially form the p⁺ semiconductor region 12a of higher concentration in the p type semiconductor region 11 by using the mask 15a in the process step of FIG. 27 between the process step of implanting n type impurities (e.g., arsenic) into the predetermined portion of the p type base region 4a and annealing the n type impurities to form the n⁺ emitter regions 5a and the next process step of forming the stripe-shaped grooves. This results in triple diffusion of p type impurities in the p type semiconductor region 11.

Addition of the above-mentioned process step of FIG. 27 to the process steps described with reference to FIGS. 18 to 25 provides the IGBT shown in FIG. 26.

<Seventh Preferred Embodiment>

Description will be given on the insulated gate semiconductor device and the method of fabricating the same of a seventh preferred embodiment according to the present invention.

<Device Construction>

Figure 28:
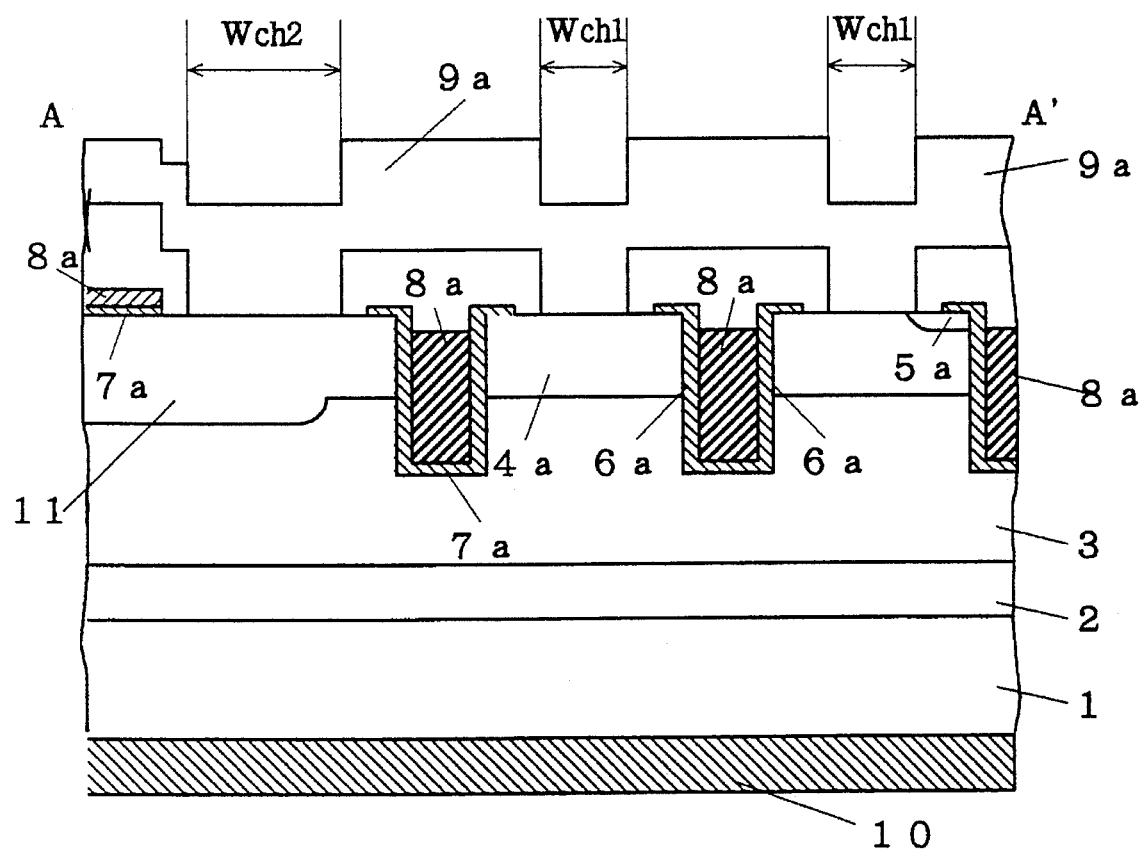
FIG. 28 is a fragmentary sectional view of the insulated gate semiconductor device of a seventh preferred embodiment according to the present invention.

The plan structure of the seventh preferred embodiment is similar to that of the fifth preferred embodiment shown in FIGS. 14 and 17. FIG. 28 illustrates a sectional structure taken along the line A–A' of FIGS. 14 and 17.

FIG. 28 illustrates the IGBT cells described with reference to FIG. 16 which are arranged in parallel such that the emitter electrodes 9a are connected to the upper surfaces of the p type base regions 4a and n⁺ emitter regions 5a of the respective IGBT cells through the contact holes $CH_1$ having the width $W_{ch1}$. In a portion adjacent the side A of FIG. 28, the p type semiconductor region 11 is formed in the surface of the n⁻ semiconductor layer 3 by double diffusion. The contact hole $CH_P$ having the width $W_{ch2}$ greater than the width $W_{ch1}$ of the contact holes $CH_1$ is formed on the top surface above the p type semiconductor region 11, and the emitter electrode 9a is connected to the p type semiconductor region 11 through the contact hole $CH_P$. In FIG. 28, the n⁺ emitter regions 5a are not formed in the IGBT cell adjacent the p type semiconductor region 11. Like reference numerals and characters are used to designate parts identical with those of FIG. 35.

In operation, when the IGBT is on, the sufficiently large width $W_{ch2}$ of the contact hole $CH_P$ in the p type semiconductor region 11 prevents overcurrent from concentrating on the IGBT cell adjacent the p type semiconductor region 11. Further, the absence of the n⁺ emitter regions 5a in the IGBT cell adjacent the p type semiconductor region 11 provides no parasitic thyristor consisting of the n⁺ emitter region 5a, the p type base region 4a, the n⁻ semiconductor layer 3 and the p⁺ semiconductor layer 1. If overcurrent concentrates on the IGBT cell adjacent the p type semiconductor region 11, the IGBT breakdown due to IGBT latch-up resulting from turning on of the parasitic thyristor is prevented.

Further, during the ON-state to OFF-state transition of the IGBT, the width $W_{ch2}$ of the contact hole $CH_P$ which is large enough to meet rapid increase in hole current can remedy the situation in which part of the hole current does not completely pass through to the emitter electrodes 9a but flows into the IGBT cell adjacent the p type semiconductor region 11. Further, the absence of the n⁺ emitter regions 5a in the IGBT cell adjacent the p type semiconductor region 11 and in the IGBT cell adjacent the foregoing IGBT cell provides no parasitic thyristor consisting of the n⁺ emitter region 5a, the p type base region 4a, the n⁻ semiconductor layer 3 and the p⁺ semiconductor layer 1. If overcurrent concentrates on the IGBT cell adjacent the p type semiconductor region 11, the IGBT breakdown due to IGBT latch-up resulting from turning on of the parasitic thyristor is prevented.

Size reduction of the IGBT cells does not interfere with the formation of the large width $W_{ch2}$ of the contact hole $CH_P$ in the p type semiconductor region 11 and the formation of the IGBT cell having no n⁺ emitter regions 5a. Thus, if the width of the IGBT cells reduced in size is less than the thickness of the n⁻ semiconductor layer 3 and more current flows in the contact hole $CH_P$ than in the contact hole $CH_1$, reduced is the likelihood of the breakdown of the IGBT cell adjacent the p type semiconductor region 11 due to latch-up as compared with that of other IGBT cells. If overcurrent concentrates on the IGBT cell adjacent the p type semiconductor region 11, the IGBT breakdown due to IGBT latch-up resulting from turning on of the parasitic thyristor is prevented.

<Fabrication Method>

Figure 29:
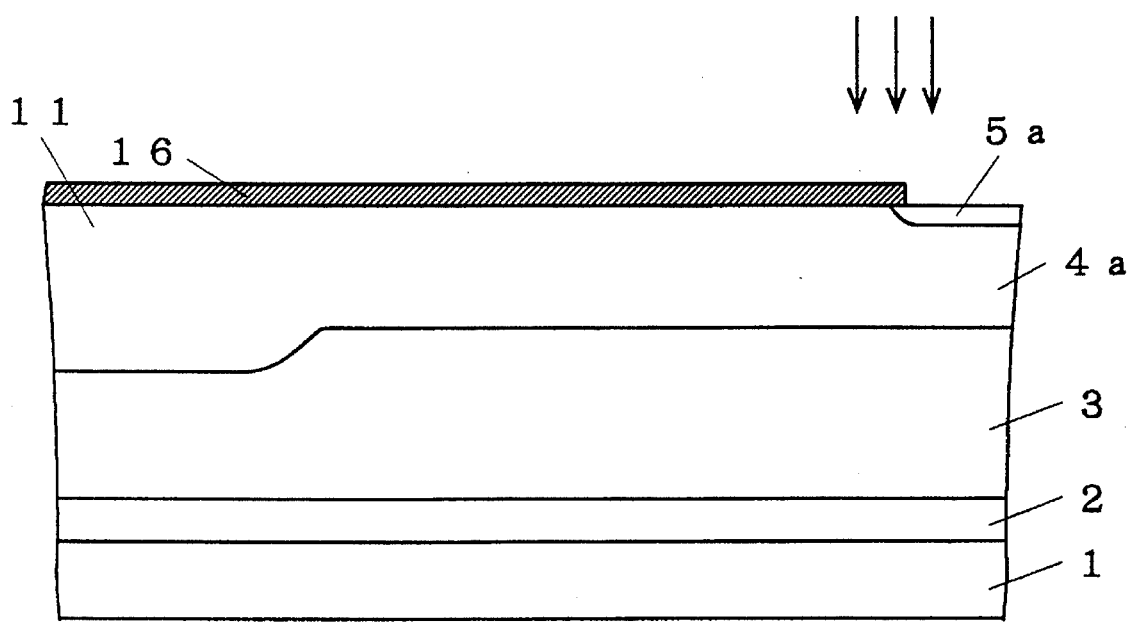
FIG. 29 is a sectional view showing a process step for fabrication of the insulated gate semiconductor device of the seventh preferred embodiment.

The method of fabricating the IGBT of FIG. 28 according to the seventh preferred embodiment is substantially similar to the method of the fifth preferred embodiment described with reference to FIGS. 18 to 25 except a difference in that n type impurities (e.g., arsenic) are implanted using an implantation mask 16 having a pattern which does not form the n⁺ emitter regions 5a adjacent the p type semiconductor region 11 as shown in FIG. 29 in the process step of forming the n⁺ emitter regions 5a.

Replacing the process step of FIG. 21 with the process step of FIG. 29 in the method of fabricating the IGBT of the fifth preferred embodiment described with reference to FIGS. 18 to 25 provides the IGBT shown in FIG. 28.

<Eighth Preferred Embodiment>

An IGBT having the advantages of both the sixth and seventh preferred embodiments is achieved by combination of the features of the sixth and seventh preferred embodiments, that is, by a structure wherein the p⁺ semiconductor layer 12a of higher concentration than the p type semiconductor region 11 is formed partially in the surface of the p type semiconductor region 11 and the n⁺ emitter regions 5a are not formed in the IGBT cell adjacent the p type semiconductor region 11.

<First Modification>

The above stated insulated gate semiconductor device and the method of fabricating the same according to present invention are applied to the IGBTs in the first to eighth preferred embodiments. The present invention, however, may be applied similarly to an EST (emitter switched thyristor) as shown in FIG. 30.

Figure 30:
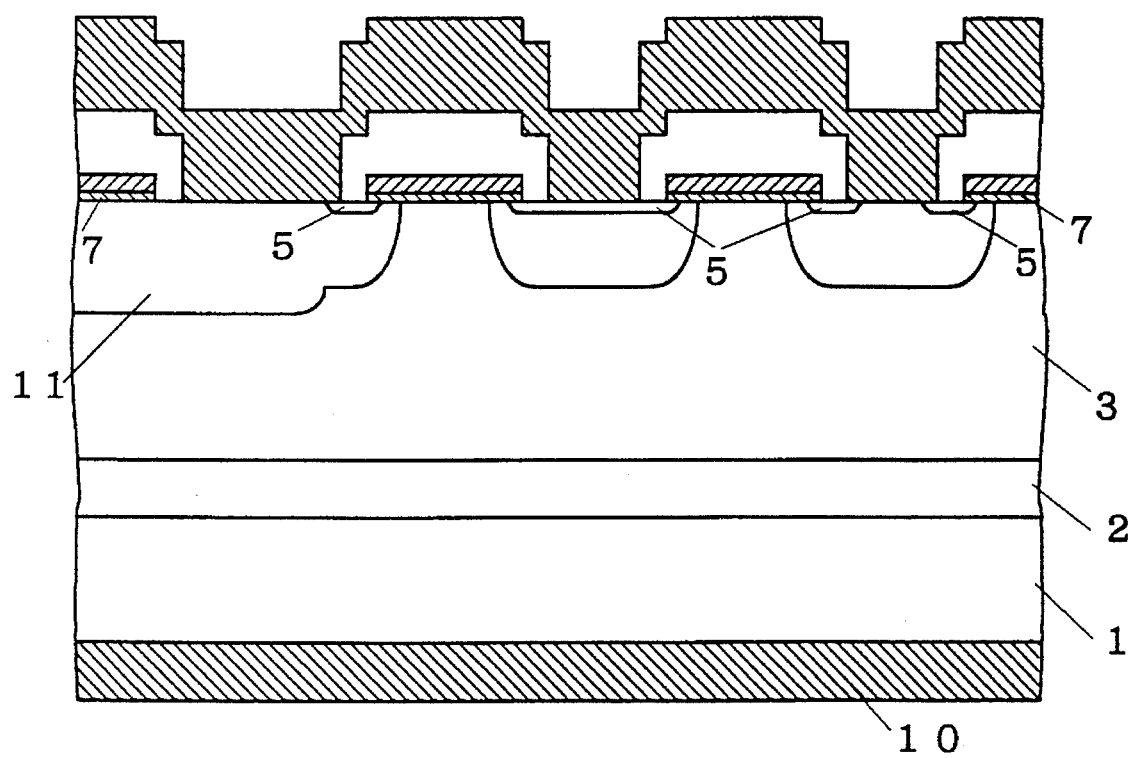
FIG. 30 is a fragmentary sectional view of a first modification of the insulated gate semiconductor device according to the present invention.

FIG. 30 is a view corresponding to FIG. 2 employed in the first preferred embodiment. Like reference numerals are used to designate parts identical with those of FIG. 2. The structure of FIG. 30 differs from that of FIG. 2 in that the n⁺ emitter regions 5 between the gate electrodes 8 are joined together in every other IGBT cell. The structures similar to those of the first to sixth preferred embodiments provide similar effects.

<Second Modification>

The insulated gate semiconductor device and the method of fabricating the same of the first to eighth preferred embodiments according to the present invention may be applied similarly to an MCT (MOS controlled thyristor) as shown in FIG. 31.

FIG. 31 is a view corresponding to FIG. 2 employed in the first preferred embodiment. Like reference numerals and characters are used to designate parts identical with those of FIG. 2. The structure of FIG. 31 differs from that of FIG. 2 in that it comprises p type base regions 4b between the gate electrodes 8, n type semiconductor regions 14 in the respective p type base regions 4b between the gate electrodes 8, and p⁺ emitter regions 5b in the n type semiconductor regions 14 in place of the n⁺ emitter regions 5, to provide a vertical triple diffusion structure. The structures similar to those of the first to sixth preferred embodiments provide similar effects.

While the invention has been shown and described in detail, the foregoing description is in all aspects illustrative and not restrictive. It is therefore understood that numerous modifications and variations can be devised without departing from the scope of the invention.

What is claimed is:

1. An insulated gate semiconductor device comprising:

a first semiconductor layer of a first conductivity type and having a first concentration;

a plurality of stripe-shaped second semiconductor layers of a second conductivity type selectively formed in parallel in a surface of said first semiconductor layer;

a plurality of third semiconductor layers of the first conductivity type and having a second concentration which is relatively higher compared to said first concentration, said third semiconductor layers being selectively formed in respective surfaces of said second semiconductor layers;

a plurality of stripe-shaped insulating layers formed on upper surfaces of said first and second semiconductor layers between ends of said third semiconductor layers in said second semiconductor layers;

a plurality of stripe-shaped control electrodes formed on said insulating layers;

a plurality of layer insulating films covering said control electrodes;

said first semiconductor layer, said second semiconductor layers, said third semiconductor layers, said insulating layers, said control electrodes, and said layer insulating films forming an active region;

a fourth semiconductor layer of the second conductivity type formed in the surface of said first semiconductor layer so as to enclose said active region; and a plurality of stripe-shaped main electrodes electrically connected to each other, said plurality of main electrodes being classified into first main electrodes formed on upper surfaces of said second and third semiconductor layers which are not covered with said layer insulating films and second main electrodes formed on an upper surface of said fourth semiconductor layer which is not covered with said layer insulating films, wherein a stripe width of said second main electrodes adjacent said active region is greater than a stripe width of said first main electrodes within said active region; and said first semiconductor layer has a thickness which is not less than 5 times a distance between centerlines of said control electrodes adjacent to each other.

2. An insulated gate semiconductor device comprising:

a first semiconductor layer of a first conductivity type and having a first concentration;

a plurality of strip-shaped second semiconductor layers of a second conductivity type selectively formed in parallel in a surface of said first semiconductor layer;

a plurality of third semiconductor layers of the first conductivity type and having a second concentration which is relatively higher compared to said first concentration, said third semiconductor layers being selectively formed in respective surfaces of said second semiconductor layers;

a plurality of stripe-shaped insulating layers formed on upper surfaces of said first and second semiconductor layers between ends of said third semiconductor layers in said second semiconductor layers;

a plurality of stripe-shaped control electrodes formed on said insulating layers;

a plurality of layer insulating films covering said control electrodes;

said first semiconductor layer, said second semiconductor layers, said third semiconductor layers, said insulating layers, said control electrodes and said layer insulating films forming an active region;

a fourth semiconductor layer of the second conductivity type formed in the surface of said first semiconductor layer so as to enclose said active region; and a plurality of stripe-shaped main electrodes electrically connected to each other, said plurality of main electrodes being classified into first main electrodes formed on upper surfaces of said second and third semiconductor layers which are not covered with said layer insulating films and second main electrodes formed on an upper surface of said fourth semiconductor layer which is not covered with said layer insulating films, wherein a stripe width of said second main electrodes adjacent said active region is greater than a stripe width of said first main electrodes within said active region; and said third semiconductor layers are not formed in said second semiconductor layers adjacent said fourth semiconductor layer.

3. An insulated gate semiconductor device comprising:

a first semiconductor layer of a first conductivity type and having a first concentration;

a plurality of stripe-shaped second semiconductor layers of a second conductivity type selectively formed in parallel in a surface of said first semiconductor layer;

a plurality of third semiconductor layers of the first conductivity type and having a second concentration which is relatively higher compared to said first concentration, said third semiconductor layers being selectively formed in respective surfaces of said second semiconductor layers;

A plurality of stripe-shaped insulating layers formed on upper surfaces of said first and second semiconductor layers between ends of said third semiconductor layers in said second semiconductor layers;

a plurality of stripe-shaped control electrodes formed on said insulating layers;

a plurality of layer insulating films covering said control electrodes;

said first semiconductor layer, said second semiconductor layers, said third semiconductor layers, said insulating layers, said control electrodes, and said layer insulating films forming an active region;

a fourth semiconductor layer of the second conductivity type formed in the surface of said first semiconductor layer so as to enclose said active region; and a plurality of stripe-shaped main electrodes electrically connected to each other, said plurality of main electrodes being classified into first main electrodes formed on upper surfaces of said second and third semiconductor layers which are not covered with said layer insulating films and second main electrodes formed on an upper surface of said fourth semiconductor layer which is not covered with said layer insulating films, wherein a stripe width of said second main electrodes adjacent said active region is greater than a stripe width of said first main electrodes within said active region; and a fifth semiconductor layer of the second conductivity type and having a higher concentration then said fourth semiconductor layer, said fifth semiconductor layer being selectively formed in the upper surface of said fourth semiconductor layer to be in contact with said second main electrodes.

4. The insulated gate semiconductor device of claim 3, wherein said first conductivity type is an N type and said second conductivity type is a P type.

5. An insulated gate semiconductor device comprising:

a first semiconductor layer of a first conductivity type and having a first concentration;

a plurality of stripe-shaped second semiconductor layers of a second conductivity type selectively formed in parallel in a surface of said first semiconductor layer;

a plurality of third semiconductor layers of the first conductivity type and having a second concentration which is relatively higher compared to said first concentration, said third semiconductor layers being selectively formed in respective surfaces of said second semiconductor layers;

a plurality of insulating films formed on upper surfaces of said third semiconductor layers and on inner wall surfaces of a plurality of stripe-shaped grooves extending from the upper surface of said third semiconductor layers in said second semiconductor layers through said second semiconductor layers into said first semiconductor layer;

a plurality of stripe-shaped control electrodes formed in said grooves having the inner wall surfaces on which said insulating films are formed;

a plurality of layer insulating films covering said control electrodes and said insulating films;

said first semiconductor layer, said second semiconductor layers, said third semiconductor layers, said insulating films, said control electrodes, and said layer insulating films forming an active region;

a fourth semiconductor layer of the second conductivity type formed in the surface of said first semiconductor layer so as to enclose said active region; and a plurality of stripe-shaped main electrodes electrically connected to each other, said plurality of main electrodes being classified into first main electrodes formed on upper surfaces of said second and third semiconductor layers which are not covered with said layer insulating films and second main electrodes formed on an upper surface of said fourth semiconductor layer which is not covered with said layer insulating films, wherein a stripe width of said second main electrodes adjacent said active region is greater than a stripe width of said first main electrodes within said active region.

6. The insulated gate semiconductor device of claim 5, wherein said first semiconductor layer has a thickness which is not less than five times a distance between centerlines of said control electrodes adjacent to each other.

7. The insulated gate semiconductor device of claim 5, wherein said third semiconductor layers are not formed in said second semiconductor layers adjacent said fourth semiconductor layer.

8. The insulated gate semiconductor device of claim 5, further comprising:

a fifth semiconductor layer of the second conductivity type and having a higher concentration than said fourth semiconductor layer, said fifth semiconductor layer being formed in the upper surface of said fourth semiconductor layer below said second main electrodes.

9. The insulated gate semiconductor device of claim 8, wherein said first conductivity type is an N type and said second conductivity type is a P type.

10. The insulated gate semiconductor device of claim 5, further comprising an additional insulating film and additional control electrode formed on the surface of the fourth semiconductor layer and having the same thickness as said plurality of insulating films and said plurality of stripe-shape control electrodes.

11. The insulated gate semiconductor device of claim 1, wherein said first conductivity type is an N type and said second conductivity type is a P type.

12. The insulated gate semiconductor device of claim 2, wherein said first conductivity type is an N type and said second conductivity type is a P type.

* * * * *